US012731634B2

(12) United States Patent
Saito

(10) Patent No.: US 12,731,634 B2
(45) Date of Patent: Sep. 8, 2026

(54) OPERATION DEVICE AND SOLID-STATE IMAGING DEVICE

(71) Applicant: Sony Semiconductor Solutions Corporation, Kanagawa (JP)

(72) Inventor: Daisuke Saito, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 282 days.

(21) Appl. No.: 18/703,917

(22) PCT Filed: Oct. 13, 2022

(86) PCT No.: PCT/JP2022/038204

§ 371 (c)(1),
(2) Date: Apr. 23, 2024

(87) PCT Pub. No.: WO2023/100490

PCT Pub. Date: Jun. 8, 2023

(65) Prior Publication Data

US 2026/0162712 A1 Jun. 11, 2026

(30) Foreign Application Priority Data

Nov. 30, 2021 (JP) ................................ 2021-193741

(51) Int. Cl.

| | |
|---|---|
| ***G11C 11/41*** | (2006.01) |
| ***G11C 11/412*** | (2006.01) |
| ***G11C 11/418*** | (2006.01) |
| ***G11C 11/54*** | (2006.01) |

(52) U.S. Cl.
CPC .......... *G11C 11/412* (2013.01); *G11C 11/418* (2013.01); *G11C 11/54* (2013.01)

(58) Field of Classification Search
CPC ...... G11C 11/412; G11C 11/418; G11C 11/54
See application file for complete search history.

(56) References Cited

U.S. PATENT DOCUMENTS

| | | | | |
|---|---|---|---|---|
| 2015/0340090 | A1* | 11/2015 | Ma | G11C 11/1675 365/148 |
| 2018/0218768 | A1* | 8/2018 | Huffman | G11C 7/12 |
| 2019/0013063 | A1* | 1/2019 | Liu | G11C 7/1057 |
| 2022/0012580 | A1* | 1/2022 | Srivastava | G11C 11/4096 |

FOREIGN PATENT DOCUMENTS

| | | |
|---|---|---|
| JP | H06076582 A | 3/1994 |
| WO | 2021215112 A1 | 10/2021 |

OTHER PUBLICATIONS

International Search Report (PCT/ISA/210), International Application No. PCT/JP2022/038204, dated Dec. 20, 2022.

* cited by examiner

*Primary Examiner* — Xiaochun L Chen
(74) *Attorney, Agent, or Firm* — Michael Best & Friedrich LLP

(57) ABSTRACT

An operation device according to an embodiment of the present disclosure includes a memory cell array including multiple memory cells. The multiple memory cells each include a first inverter including a first input unit and a first output unit, a second inverter including a second input unit coupled to the first output unit and a second output unit coupled to the first input unit and outputting a first signal, a first transistor to which the first signal is inputted from the second output unit, and a resistor coupled in series to the first transistor.

20 Claims, 23 Drawing Sheets

1
201
RECORDING UNIT
214
MEMORY SIGNAL PROCESSING CIRCUIT
212
INPUT-OUTPUT UNIT
215
L2
200
MEMORY CELL ARRAY
20
L1
MEMORY CONTROL CIRCUIT
211
101
100
PIXEL UNIT
P
COLUMN SIGNAL PROCESSING CIRCUIT
HORIZONTAL DRIVE CIRCUIT
Lread
Lsig
112
113
111
VERTICAL DRIVE CIRCUIT
115
CONTROL CIRCUIT

[ FIG. 6 ]
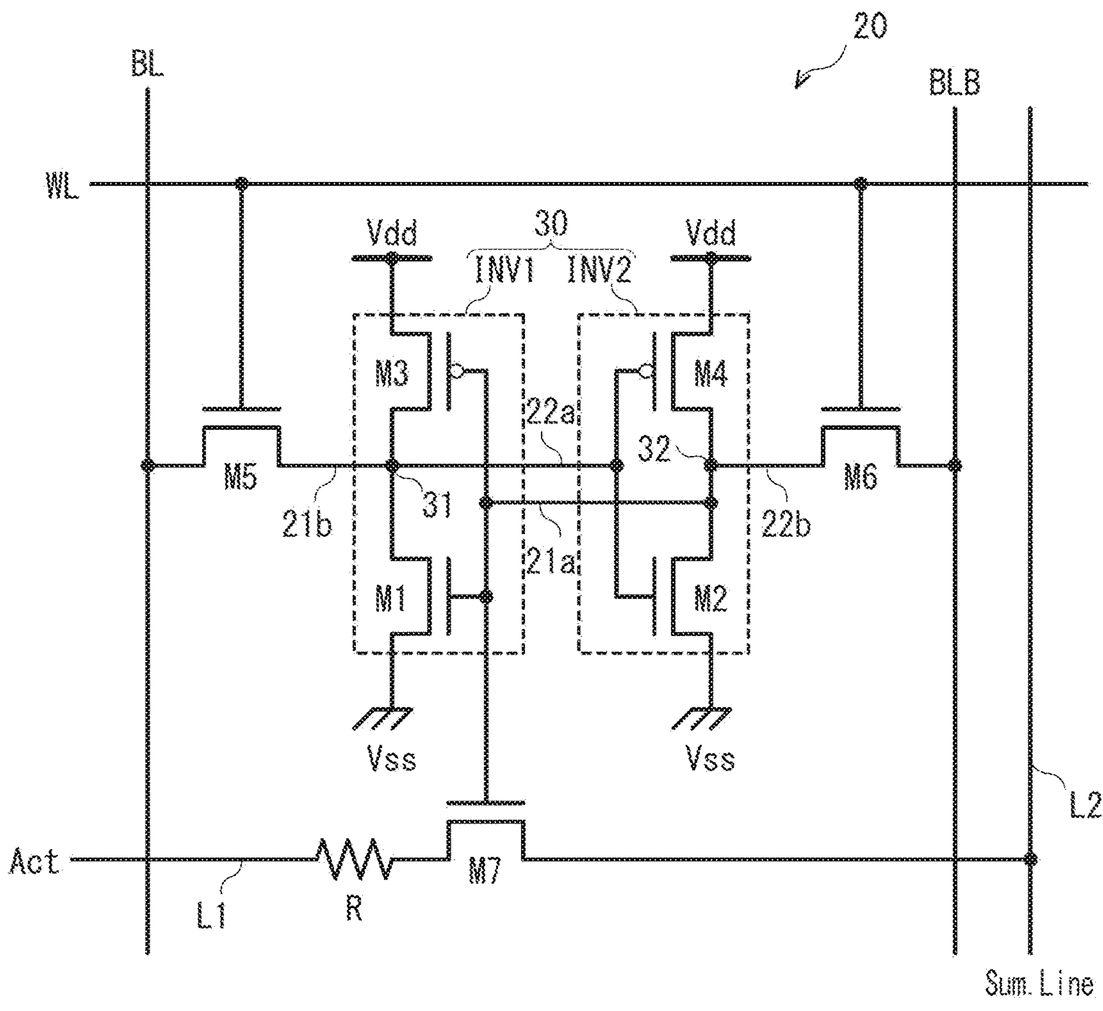

[ FIG. 7 ]
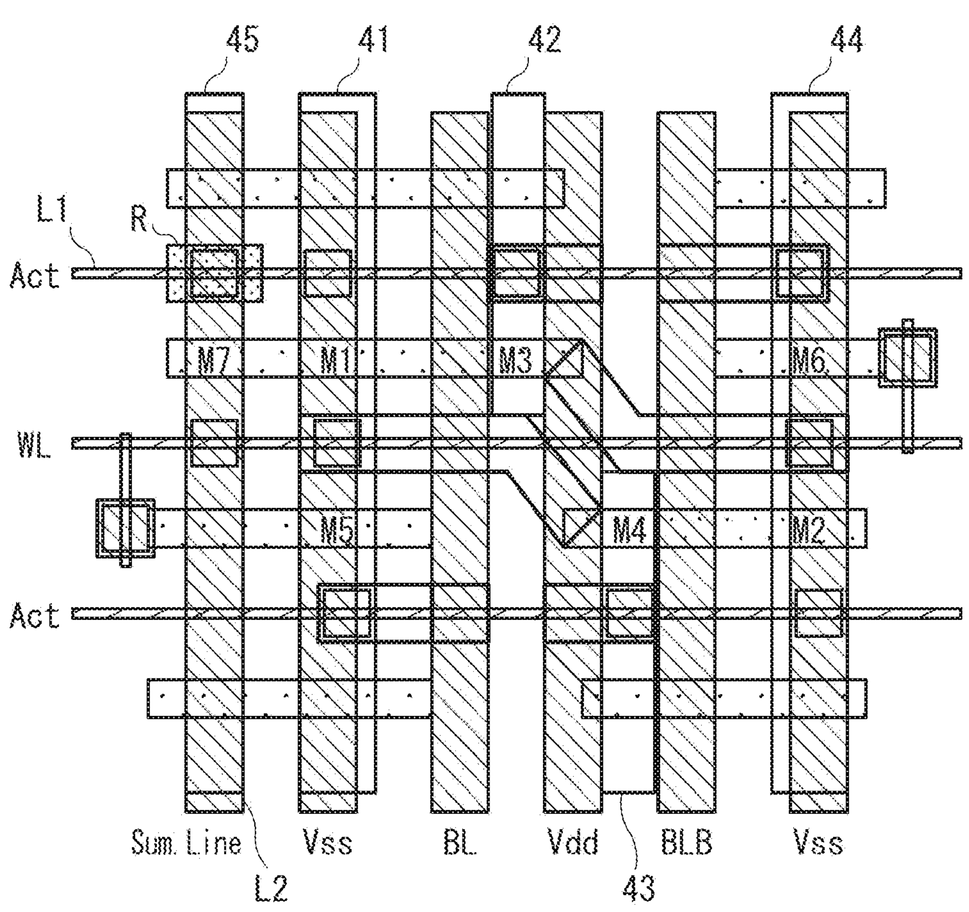

[ FIG. 8 ]
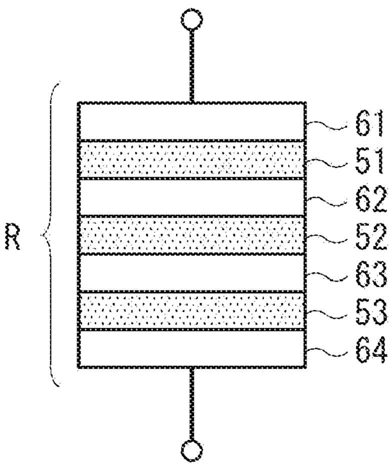
[ FIG. 9 ]
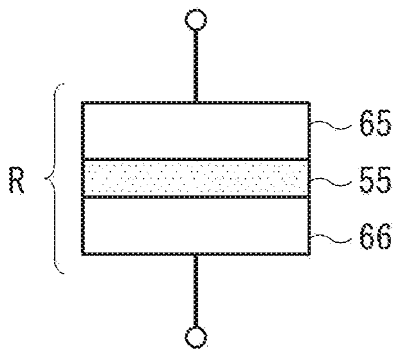

[ FIG. 10 ]
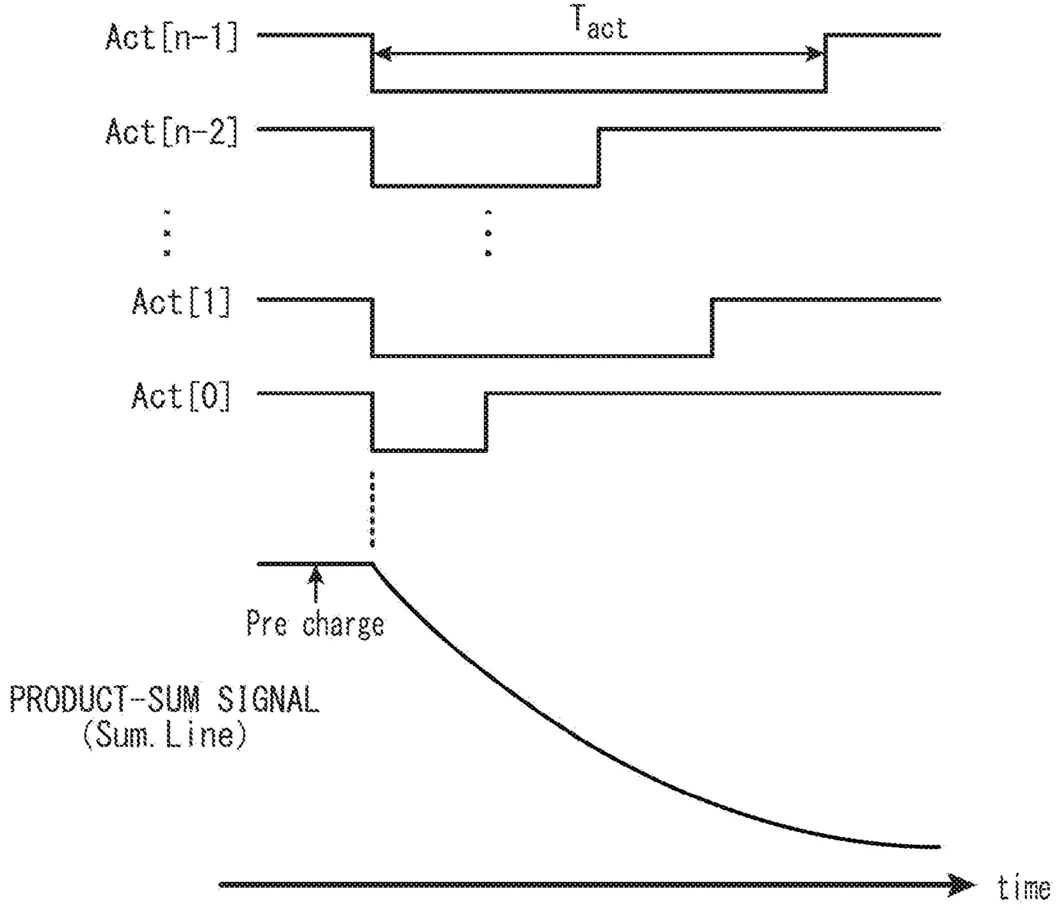

[ FIG. 11 ]
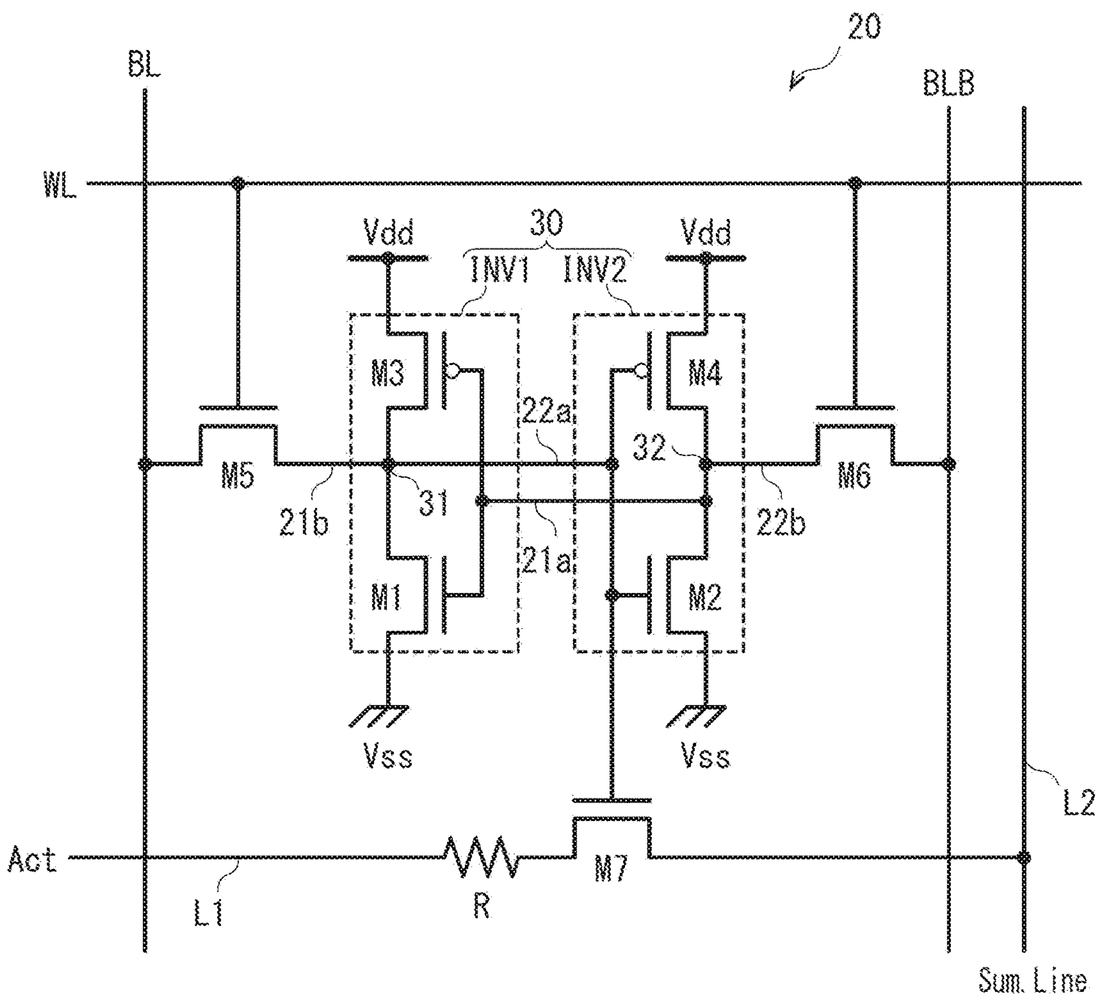

FIG. 12
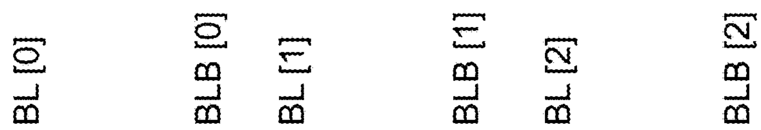
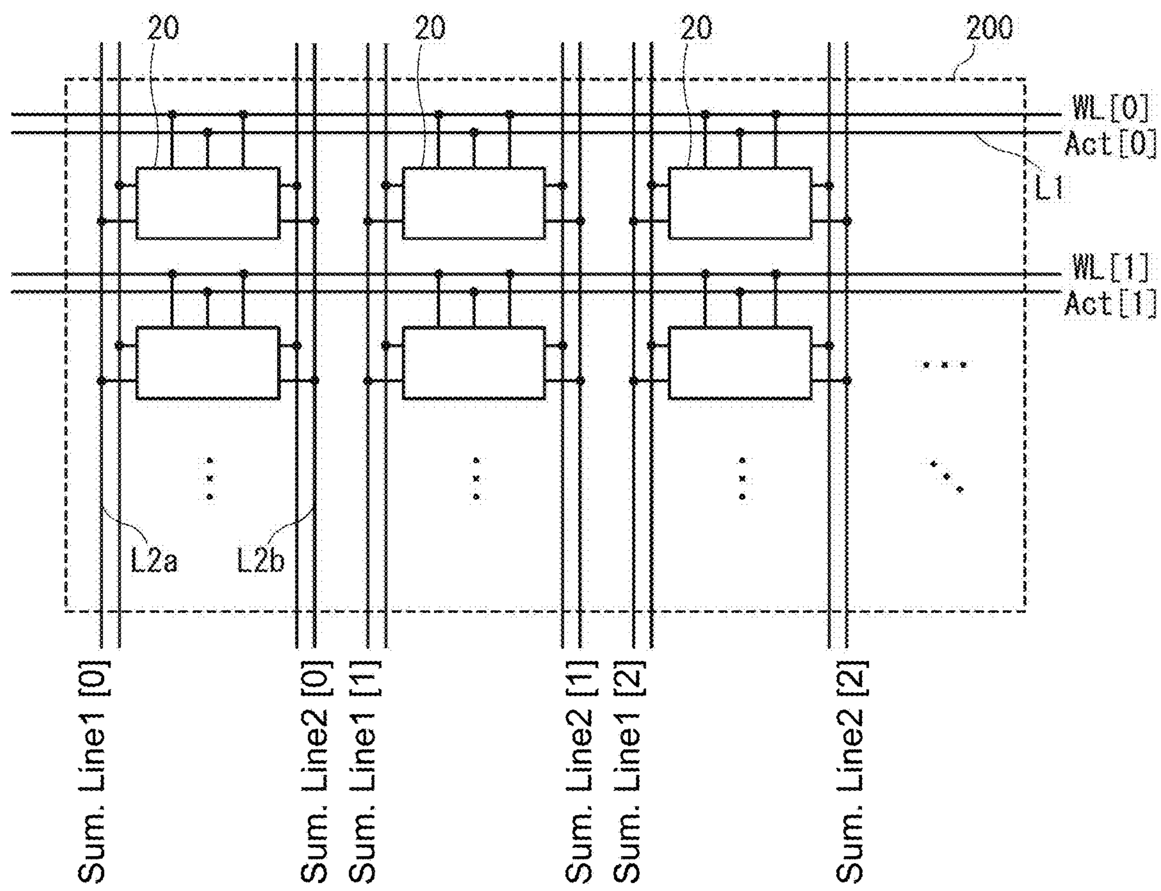

[ FIG. 24 ]
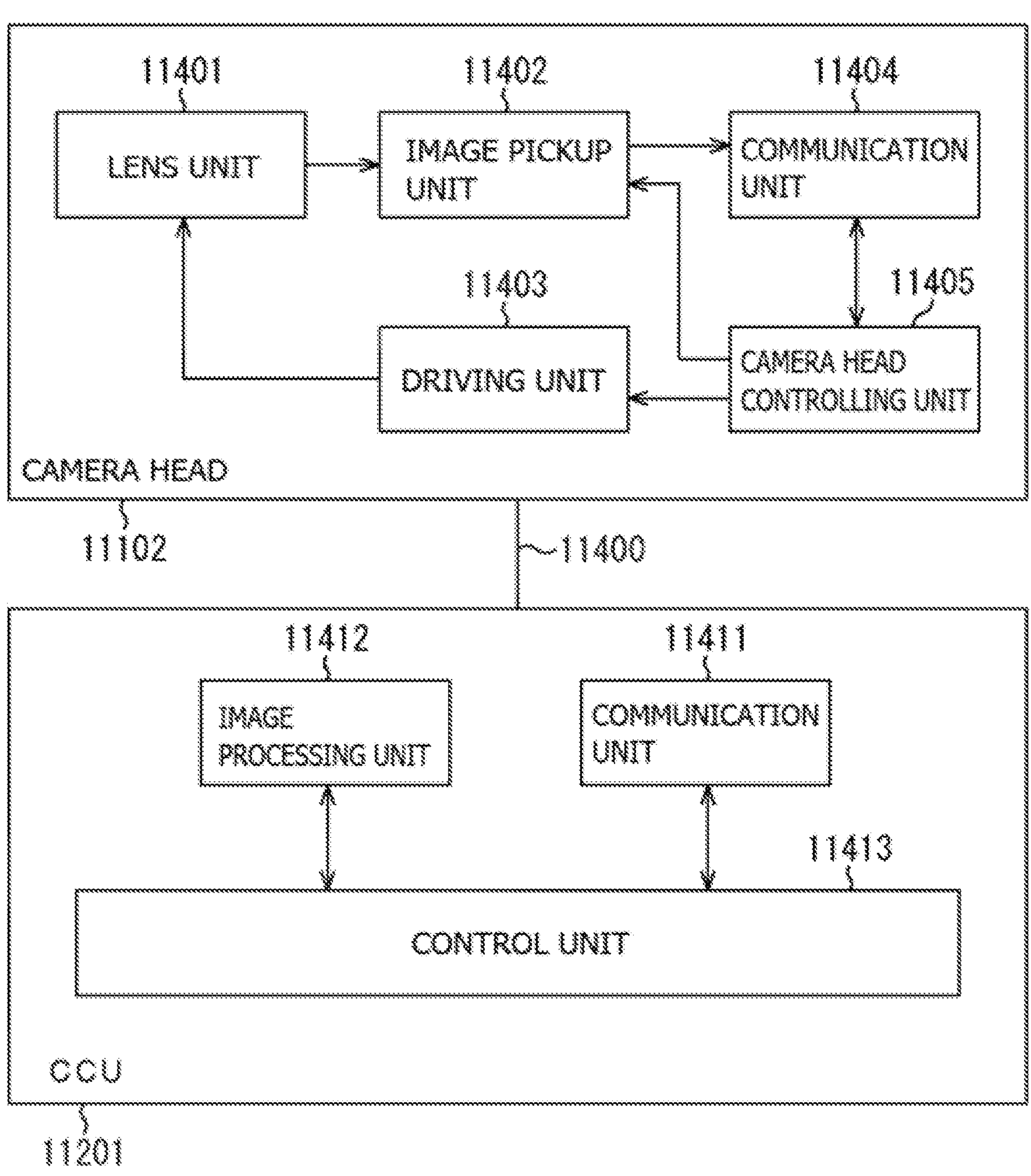

OPERATION DEVICE AND SOLID-STATE IMAGING DEVICE

TECHNICAL FIELD

The present disclosure relates to an operation device and a solid-state imaging device.

BACKGROUND ART

A flip-flop memory cell in which data is written by hot electron injection has been proposed (Patent Literature 1). In addition, it is expected to provide an operation device that makes it possible to perform a product-sum operation on a memory cell array using static random access memory (SRAM) technology.

CITATION LIST

Patent Literature

PTL 1: Japanese Unexamined Patent Application Publication No. H6-76582

SUMMARY OF THE INVENTION

It is required for an operation device to suppress an increase in a memory cell area.

It is desirable to provide an operation device that makes it possible to suppress an increase in a memory cell area.

An operation device according to one embodiment of the present disclosure includes a memory cell array including multiple memory cells. The multiple memory cells each include a first inverter including a first input unit and a first output unit, a second inverter including a second input unit coupled to the first output unit and a second output unit coupled to the first input unit and outputting a first signal, a first transistor to which the first signal is inputted from the second output unit, and a resistor coupled in series to the first transistor.

A solid-state imaging device according to one embodiment of the disclosure includes a memory cell array including multiple memory cells. The multiple memory cells each include first inverter including a first input unit and a first output unit, a second inverter including a second input unit coupled to the first output unit and a second output unit coupled to the first input unit and outputting a first signal, a first transistor to which the first signal is inputted from the second output unit, and a resistor coupled in series to the first transistor.

BRIEF DESCRIPTION OF THE DRAWINGS

FIG. 6 is a diagram illustrating a configuration example of a memory cell of the imaging device according to the embodiment of the present disclosure.

FIG. 7 is a diagram illustrating a layout example of the memory cells of the imaging device according to the embodiment of the present disclosure.

FIG. 8 is a diagram illustrating a configuration example of a resistor of the imaging device according to the embodiment of the present disclosure.

FIG. 9 is a diagram illustrating another configuration example of the resistor of the imaging device according to the embodiment of the present disclosure.

FIG. 10 is a diagram illustrating an example of a product-sum operation process performed by the imaging device according to the embodiment of the present disclosure.

FIG. 11 is a diagram illustrating another configuration example of the memory cell of the imaging device according to the embodiment of the present disclosure.

FIG. 12 is a diagram illustrating a configuration example of a memory cell array of an imaging device according to Modification Example 1 of the present disclosure.

FIG. 24 is a block diagram depicting an example of a functional configuration of a camera head and a camera control unit (CCU).

MODES FOR CARRYING OUT THE INVENTION

Hereinafter, an embodiment of the present disclosure is described in detail with reference to the drawings. It is to be noted that the description is given in the following order.

1. Embodiment
2. Modification Examples

3. Application Examples
4. Practical Application Examples

1. Embodiment

Figure 1:
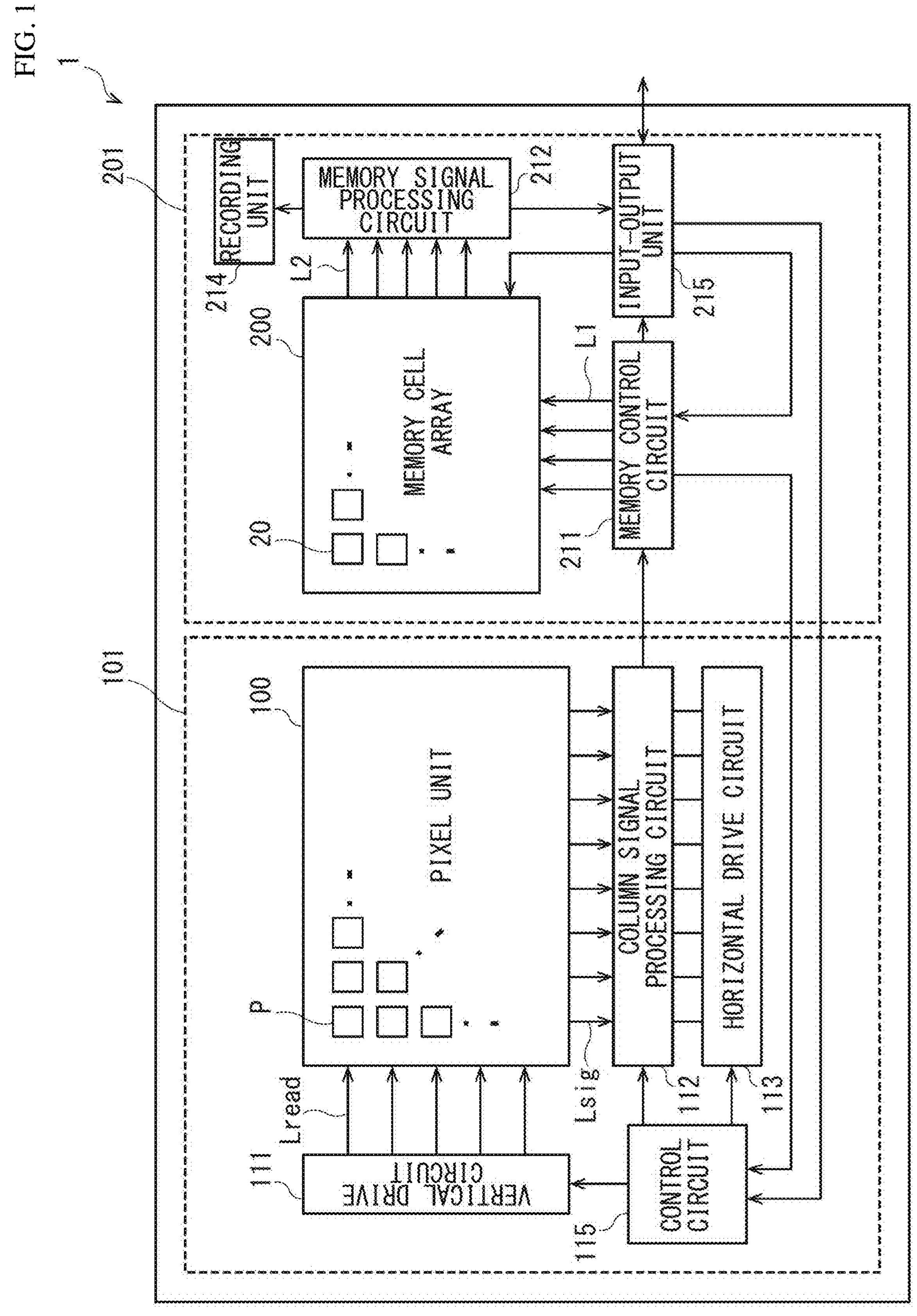
FIG. 1 is a block diagram illustrating an example of an overall configuration of an imaging device according to an embodiment of the present disclosure.

FIG. 1 is a block diagram illustrating an example of an overall configuration of an imaging device 1 that is an example of an operation device according to an embodiment of the present disclosure. The imaging device 1 is a solid-state imaging device, and photoelectrically converts incident light and captures an image of a subject. The imaging device 1 includes a memory cell array configured to perform a product-sum operation, implementing computing in memory (CIM) that performs an operation on the memory cell array that is a non-von Neumann calculation unit. The use of the memory cell array for the product-sum operation in a neural network is expected to solve a problem with a Neumann calculation unit, such as an increase in circuit scale and electric power consumption. The imaging device 1, which is a solid-state imaging device, is, for example, a complementary metal oxide semiconductor (CMOS) image sensor.

In the imaging device 1, multiple pixels each including a photoelectric conversion unit are two-dimensionally provided. The imaging device 1 takes in incident light (image light) from the subject via an optical lens system (not illustrated). The imaging device 1 converts the light amount of the incident light formed on an imaging surface into an electric signal on a pixel unit basis, and outputs the electric signal as a pixel signal. The imaging device 1 may be used in an electronic device such as a digital still camera or a video camera.

[Schematic Configuration of Imaging Device]

The imaging device 1 includes a pixel unit 100 as an imaging area. In the pixel unit 100, multiple pixels P are two-dimensionally arranged. In other words, the pixel unit 100 is a pixel array in which the pixels P are arranged in a matrix. Further, the imaging device 1 includes a memory cell array 200 in which multiple memory cells 20 are arranged in a matrix. In the example illustrated in FIG. 1, the imaging device 1 includes a first substrate 101 and a second substrate 201. The first substrate 101 and the second substrate 201 are each configured by a semiconductor substrate (for example, a silicon substrate), and are stacked so as to overlap each other.

The pixel unit 100 is provided on the first substrate 101. The memory cell array 200 is provided on the second substrate 201. Note that the memory cell array 200 may have a rectangular (vertically long or horizontally long) aspect or a square aspect. The memory cell array 200 may be disposed at any position (a right end, a middle, an upper end, or the like) of the second substrate 201. The pixel unit 100 and the memory cell array 200 may be provided on the same substrate. Note that the substrate on which the memory cell array 200 is provided may be a substrate of an oxide semiconductor, a compound semiconductor, or the like.

As illustrated in FIG. 1, the imaging device 1 includes, for example, a vertical drive circuit 111, a column signal processing circuit 112, a horizontal drive circuit 113, and a control circuit 115 in a peripheral region of the pixel unit 100. The imaging device 1 further includes, for example, a memory control circuit 211, a memory signal processing circuit 212, a recording unit 214, and an input-output unit 215 in a peripheral region of the memory cell array 200.

Figure 2:
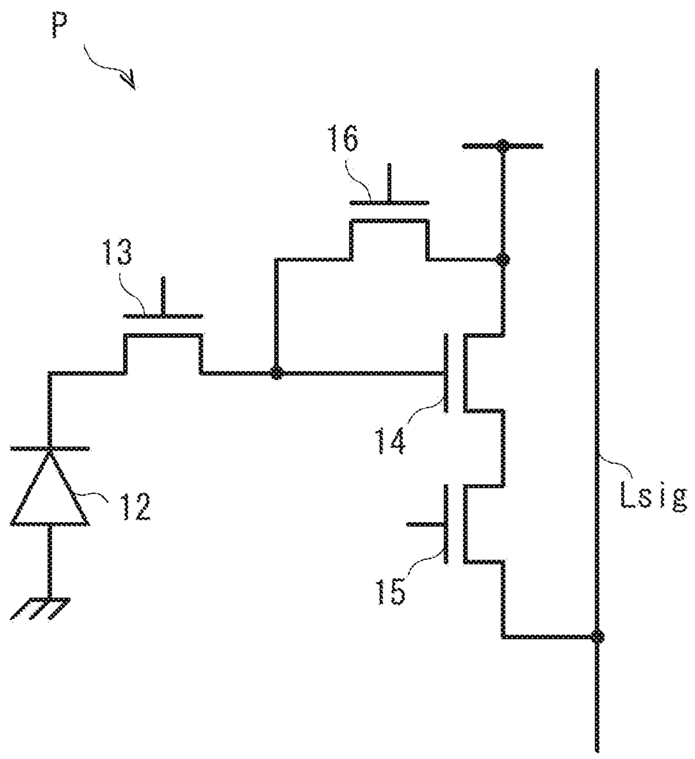
FIG. 2 is a diagram illustrating a configuration example of a pixel of the imaging device according to the embodiment of the present disclosure.

The pixel P includes a photoelectric conversion unit and multiple pixel transistors. The photoelectric conversion unit is, for example, a photodiode. The multiple pixel transistors include, for example, a transfer transistor, an amplifying transistor, a selection transistor, and a reset transistor. As in an example illustrated in FIG. 2, the pixel P includes, for example, a photoelectric conversion unit 12 that is a photodiode, a transfer transistor 13, an amplifying transistor 14, a selection transistor 15, and a reset transistor 16. The pixel P generates a pixel signal based on an electric charge photoelectrically converted by the photoelectric conversion unit.

The multiple pixels P of the pixel unit 100 include a pixel including a filter that transmits light in a red wavelength range (R pixel), a pixel including a filter that transmits light in a green wavelength range (G pixel), and a pixel including a filter that transmits light in a blue wavelength range (B pixel). The R pixel, the G pixel, and the B pixel are arranged in accordance with a so-called Bayer arrangement, for example. The R pixel, the G pixel, and the B pixel generate a pixel signal of an R component, a pixel signal of a G component, and a pixel signal of a B component, respectively. Therefore, the imaging device 1 is configured to obtain RGB pixel signals. The filters provided in the pixels P are not limited to color filters of a primary color system (RGB), and may be color filters of a complementary color system including cyan (Cy), magenta (Mg), and yellow (Ye), for example.

Figure 3:
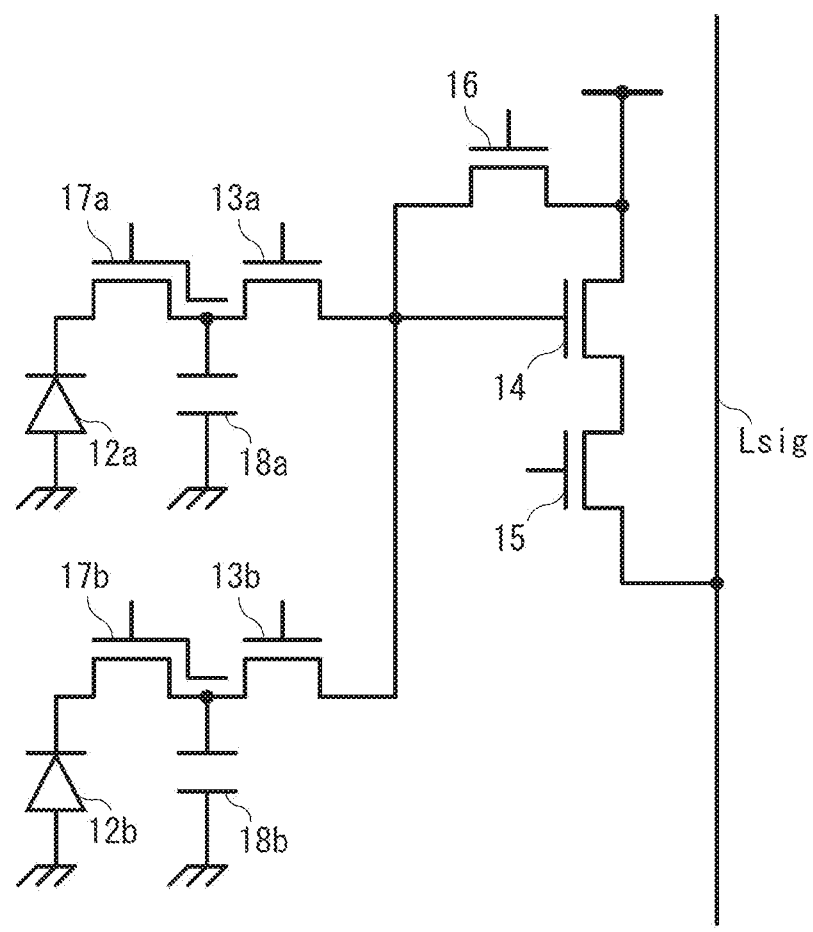
FIG. 3 is a diagram illustrating another configuration example of the pixel of the imaging device according to the embodiment of the present disclosure.
Figure 4:
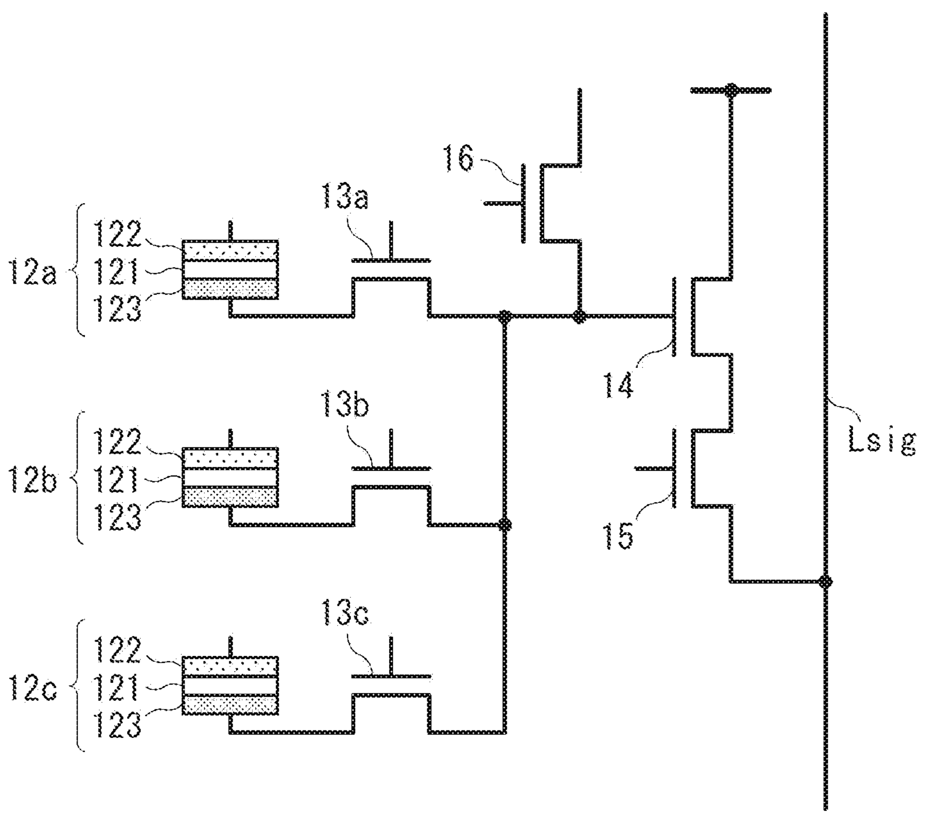
FIG. 4 is a diagram illustrating another configuration example of the pixel of the imaging device according to the embodiment of the present disclosure.

Note that the configuration of the pixel P is not limited to the above-described example. FIGS. 3 and 4 are diagrams illustrating other configuration examples of the pixel of the imaging device 1 according to the embodiment of the present disclosure. The pixel P may include a memory transistor and a capacitor that are configured to hold a charge. In an example illustrated in FIG. 3, a memory transistor 17*a* and a capacitor 18*a* may hold a charge photoelectrically converted by a photoelectric conversion unit 12*a*, and a memory transistor 17*b* and a capacitor 18*b* may hold a charge photoelectrically converted by a photoelectric conversion unit 12*b*. It is to be noted that, as in the example illustrated in FIG. 3, the amplifying transistor 14, the selection transistor 15, the reset transistor 16, and the like may be arranged with respect to multiple photoelectric conversion units, or may be shared by the multiple pixels P. The amplifying transistor 14 and the selection transistor 15 are each configured to output pixel signals based on the charges photoelectrically converted by the photoelectric conversion unit 12*a* and pixel signals based on the charges photoelectrically converted by the photoelectric conversion unit 12*b*, respectively.

In an example illustrated in FIG. 4, the photoelectric conversion units 12*a* to 12*c* each include a photoelectric conversion film 121, an upper electrode 122, and a lower electrode 123. The photoelectric conversion film 121 includes an organic material or an inorganic material, and converts incident light into an electric charge. The amplifying transistor 14 and the selection transistor 15 are coupled to a transfer transistor 13*a*, and are configured to output pixel signals based on the charges photoelectrically converted by the photoelectric conversion unit 12*a*. Further, the amplifying transistor 14 and the selection transistor 15 are coupled to transfer transistors 13*b* and 13*c*, and are configured to output a pixel signals based on the charge generated by the photoelectric conversion unit 12*b* and a pixel signal based on the charge generated by the photoelectric conversion unit 12*c*, respectively.

Note that the pixel P may be a pixel configured to output a pixel signal by a pulse-width modulation (PWM) method Alternatively, the pixel P may be a dynamic vision sensor (DVS) pixel, and may be configured to output a pixel signal indicating that the amount of received light has changed beyond a predetermined threshold. In addition, so-called convolution pixels may be arranged in the pixel unit 100 so that a pixel signal obtained by adding pixel signals of the respective pixels is outputted.

In the pixel unit 100 illustrated in FIG. 1, multiple pixel rows each including multiple pixels P arranged in a horizontal direction and multiple pixel columns each including multiple pixels P arranged in a vertical direction are provided. In the pixel unit 100, for example, a pixel drive line Lread (a row selection line, a reset control line, and the like) is wired for each pixel row, and a vertical signal line Lsig is wired for each pixel column. The pixel drive line Lread transmits a driving signal to read a signal from the pixel. One end of the pixel drive line Lread is coupled to an output terminal corresponding to each pixel row of the vertical drive circuit 111.

The vertical drive circuit 111 includes a shift register, an address decoder, and the like. The vertical drive circuit 111 sequentially selects and scans each pixel of the pixel unit 100 to cause each pixel to output a pixel signal. The vertical drive circuit 111 is a pixel drive unit that drives each pixel P of the pixel unit 100 on a row-unit basis, for example. In other words, the vertical drive circuit 111 is a pixel control circuit that controls the pixels P. The signal outputted from each pixel P of the pixel row selected and scanned by the vertical drive circuit 111 is supplied to the column signal processing circuit 112 through the vertical signal line Lsig.

The column signal processing circuit 112 includes an amplifier, a horizontal selection switch, and the like provided for each vertical signal line Lsig. The column signal processing circuit 112 performs signal processing such as correlated double sampling (CDS) processing and analog-to-digital (AD) conversion processing on the pixel signals of the respective pixels. In other words, the column signal processing circuit 112 is a pixel signal processing circuit that processes a signal outputted from the pixel P.

The horizontal drive circuit 113 includes a shift register, an address decoder, and the like, and sequentially drives the horizontal selection switches of the column signal processing circuit 112 while scanning them. By the selection scanning by the horizontal drive circuit 113, the pixel signals of the respective pixels subjected to the signal processing by the column signal processing circuit 112 are sequentially transmitted to the memory control circuit 211.

The control circuit 115 receives an externally input clock, data for commanding an operation mode, and the like, and controls each unit of the imaging device 1. The control circuit 115 includes a timing generator that generates various timing signals, and performs drive control of peripheral circuits such as the vertical drive circuit 111, the column signal processing circuit 112, and the horizontal drive circuit 113 based on the various timing signals generated by the timing generator.

The memory control circuit 211 includes a shift register, an address decoder, and the like. As illustrated in FIG. 1, the memory control circuit 211 and the memory cell array 200 are arranged side by side in the vertical direction. The memory control circuit 211 supplies a signal that controls each memory cell 20 to each memory cell 20 of the memory cell array 200, and controls the operation of each memory cell 20. The memory control circuit 211 causes each memory cell 20 of the memory cell array 200 to perform the product-sum operation, and causes the memory signal processing circuit 212 to output a signal (product-sum signal) obtained by the product-sum operation.

The memory control circuit 211 outputs, for example, a control signal associated with the pixel signal of each pixel inputted from the column signal processing circuit 112 to each memory cell 20 of the memory cell array 200. The memory control circuit 211 generates a control signal (for example, a signal Act to be described later) in accordance with the inputted pixel signal, and outputs the control signal to each memory cell 20 of the memory cell array 200. The product-sum operation is performed using the control signal inputted to each memory cell 20 and the data held in each memory cell 20 in accordance with the pixel signal, and the generated product-sum signal is transmitted to the memory signal processing circuit 212. Further, the memory control circuit 211 may output the pixel signal of each pixel inputted from the column signal processing circuit 112 to the outside via the input-output unit 215.

The memory signal processing circuit 212 includes an analog to digital converter (ADC) and the like, and performs various types of signal processing on the product-sum signal read from the memory cell array 200. As illustrated in FIG. 1, the memory signal processing circuit 212 and the memory cell array 200 are arranged side by side in the lateral direction. For example, the memory signal processing circuit 212 performs AD conversion processing on the product-sum signal that is an analog signal outputted from the memory cell array 200. The memory signal processing circuit 212 outputs the product-sum signal converted into a digital signal to the input-output unit 215. Note that the memory signal processing circuit 212 may perform processing such as processing using an activation arithmetic function, pooling processing, and the like, and output the processed product-sum signal to the input-output unit 215.

The ADC of the memory signal processing circuit 212 is, for example, a single-slope ADC. The ADC may be an AD conversion circuit of another type, such as a double integral type, a successive approximation register (SAR) type, a delta-sigma type, or the like. An ADC that detects a difference as in a case of a dynamic vison sensor (DVS) may be used. The resolution of the ADC, that is, the number of bits of the AD conversion may be 1 bit or 2 bits or more (for example, 10 bits or 12 bits).

The memory signal processing circuit 212 causes the recording unit 214 to record signals, parameters, and the like inputted from an external apparatus (for example, an image processing apparatus) via the input-output unit 215, and changes signal processing to be executed based on an instruction from the external apparatus. The recording unit 214 includes a memory in which data such as signals and parameters used for the signal processing performed by the memory signal processing circuit 212 are recorded.

The input-output unit 215 outputs the signals sequentially inputted from the memory signal processing circuit 212 to an external device, for example, an image signal processor (ISP). Further, the input-output unit 215 outputs a signal or a parameter inputted from the external device to the memory signal processing circuit 212 or the control circuit 115.

The input-output unit 215 may write data to the memory cells 20 of the memory cell array 200. The input-output unit 215 writes, for example, a data value indicating a learning result inputted from the external device into each memory cell 20 of the memory cell array 200. In addition, the input-output unit 215 may reflect the result of calculation by the memory signal processing circuit 212 on the data of the memory cell 20 to update the learning result. Note that the memory control circuit 211 or the memory signal processing circuit 212 may write data to the memory cells 20 of the memory cell array 200. The memory control circuit 211 or the memory signal processing circuit 212 may change the data to be held in each memory cell 20 depending on the data acquired by the input-output unit 215.

[Configuration of Memory Cell Array]

Figure 5:
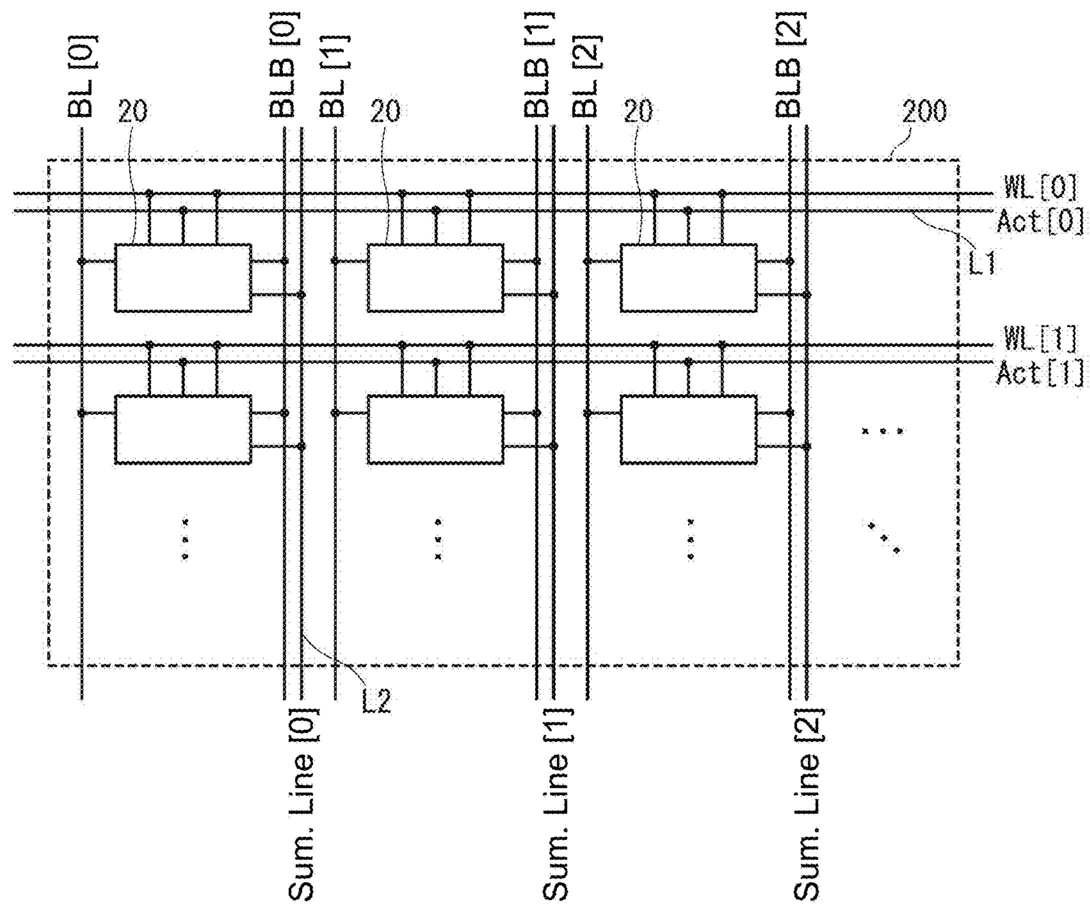
FIG. 5 is a diagram illustrating a configuration example of a memory cell array of the imaging device according to the embodiment of the present disclosure.

FIG. 5 is a diagram illustrating a configuration example of the memory cell array 200 of the imaging device I according to the embodiment of the present disclosure. As illustrated in FIG. 5, in the memory cell array 200 of the imaging device 1, the multiple memory cells 20 are arranged in the horizontal direction (row direction), which is a first direction, and in the vertical direction (column direction), which is a second direction orthogonal to the first direction. In other words, the multiple memory cells 20 are arranged in a left-right direction (the horizontal direction of the page) and an up-down direction (the vertical direction of the page).

In the memory cell array 200, a word line WL and a signal line L1 to which the signal Act to be described later is transmitted are provided for each of the multiple memory cells 20 arranged in the horizontal direction. In other words, the word line WL and the signal line L1 are provided for a memory cell row including the multiple memory cells 20 aligned in the horizontal direction. Each of the word line WL and the signal-line L1 is, for example, a wire extending in the horizontal direction.

In the memory cell array 200, a first bit line BL, a second bit line BLB, and a signal line L2 to which the product-sum signal is transmitted are provided for each of the multiple memory cells 20 arranged in the vertical direction. In other words, the first bit line BL, the second bit line BLB, and the signal line L2 are provided for a memory cell column including the multiple memory cells 20 aligned in the vertical direction. Each of the first bit line BL, the second bit line BLB, and the signal line L2 is, for example, a wire extending in the vertical direction. For example, the signal line L2 and the memory control circuit 211 are arranged side by side in the horizontal direction. The signal lines L2 and the memory signal processing circuit 212 are arranged side by side in the vertical direction.

As described above, in the memory cell array 200, the word line WL and the signal line L1 are wired for each memory cell row, and the first bit line BL, the second bit line BLB, and the signal line L2 are wired for each memory cell column. In other words, the memory cell 20 is arranged at an intersection of the corresponding word line WL and the pair of first bit lines BL and the second bit line BLB As an example, the word line WL and the signal line L1 are coupled to the memory control circuit 211 described above. The memory control circuit 211 supplies a signal to the word line WL and supplies the signal Act to the signal line L1. The first bit line BL and the second bit line BLB are coupled to the input-output unit 215 or the memory control circuit 211, for example. The first bit line BL and the second bit line BLB are supplied with signals by the input-output unit 215 or the memory control circuit 211, and the signals are transmitted to the respective memory cells 20. The signal line L2 is coupled to the memory signal processing circuit 212. The product-sum signal is inputted to the memory signal processing circuit 212 via the signal line L2.

[Configuration of Memory Cell]

FIG. 6 is a diagram illustrating a configuration example of the memory cell 20 of the imaging device 1 according to the embodiment of the present disclosure. FIG. 7 is a diagram illustrating a layout example of the memory cell 20. The memory cell 20 includes a first inverter INV1, a second inverter INV2, a transistor M5, a transistor M6, a transistor M7, and a resistor R. The memory cell 20 is a memory element configured to record one-bit data. The memory cell 20 includes a flip-flop circuit 30 including the first inverter INV1 and the second inverter INV2. In other words, the memory cell 20 is a flip-flop memory cell.

The first inverter INV1 includes a transistor MI and a transistor M3 coupled in series. The first inverter INV1 includes an input unit 21*a* and an output unit 21*b*, and is configured to output an inverted signal of an input signal. The second inverter INV2 includes a transistor M2 and a transistor M4 coupled in series. The second inverter INV2 includes an input unit 22*a* and an output unit 22*b*, and is configured to output an inverted signal of an input signal. The input unit 21*a* of the first inverter INV1 is electrically coupled to the output unit 22*b* of the second inverter INV2, and the output unit 21*b* of the first inverter INV1 is electrically coupled to the input unit 22*a* of the second inverter INV2.

Each of the transistors M1 to M7 is a MOS transistor (MOSFET) having gate, source, and drain terminals. The transistors M1 and M2 are NMOS transistors, and the transistors M3 and M4 are PMOS transistors. The transistors M5, M6, and M7 are, for example, NMOS transistors. Note that the transistors of the memory cell 20 may be MISFETs.

The gates of the transistors MI and M3 are electrically coupled to each other to form the input unit 21*a*. The gates of the transistors M2 and M4 are electrically coupled to each other to form the input unit 22*a*. The sources of the transistors MI and M2 are coupled to a ground line. The sources of the transistors M3 and M4 are coupled to a power supply line.

The drain of the transistor M1 and the drain of the transistor M3 are electrically coupled to each other and constitute the output unit 21*b*. The drain of the transistor M2 and the drain of the transistor M4 are electrically coupled to each other and constitute the output unit 22*b*. A first holding node 31 and a second holding node 32 illustrated in FIG. 6 are nodes configured to hold signals. The first holding node 31 is a node that couples the output unit 21*b* of the first inverter INV1 and the input unit 22*a* of the second inverter INV2. The second holding node 32 is a node that couples the output unit 22*b* of the second inverter INV2 and the input unit 21*a* of the first inverter INV1. The memory cell 20 stores a digital signal in accordance with the level of the potential of the first holding node 31 and the level of the potential of the second holding node 32. In other words, the first holding node 31 and the second holding node 32 are storage nodes.

The gates of the transistors M5 and M6 are each electrically coupled to the word line WL. Each of the transistors MS and M6 is controlled to be an on-state (conductive state) or an off-state (non-conductive state) by a signal inputted through the word line WL. One of the source and the drain of the transistor MS is electrically coupled to the input unit 22*a* of the second inverter INV2 and the output unit 21*b* of the first inverter INV1. The other of the source and the drain of the transistor M5 is coupled to the first bit line BL. The transistor M5 electrically couples or uncouples the output unit 21*b* of the first inverter INV1 and the first bit line BL.

One of the source and the drain of the transistor M6 is electrically coupled to the input unit 21*a* of the first inverter INV1 and the output unit 22*b* of the second inverter INV2. The other of the source and the drain of the transistor M6 is coupled to the second bit line BLB. The transistor M6 electrically couples or uncouples the output unit 22*b* of the second inverter INV2 and the second bit line BLB.

The gate of the transistor M7 is electrically coupled to the second holding node 32, and receives a signal from the output unit 22*b* of the second inverter INV2. The transistor M7 is brought into the on-state or the off-state in accordance with the potential of the second holding node 32. One of the source and the drain of the transistor M7 is coupled in series to the resistor R, and is electrically coupled to the signal line L1 to which the signal Act is inputted (transmitted). The other of the source and the drain of the transistor M7 is electrically coupled to the signal line L2. The signal line L2 is a summation line. The transistor M7 is configured to generate a current corresponding to the potential of the second holding node 32 applied to the gate and the potential of the signal Act, and supply the generated current to the signal line L2.

In the example illustrated in FIG. 7, the transistors MI and M5 are formed in an active area 41. The transistor M3 is formed in an active region 42, and the transistor M4 is formed in an active region 43. In addition, the transistors M2 and M6 are formed in an active area 44. The transistor M7 is formed in an active area 45. In the example illustrated in FIG. 7, the gates of the transistors M1, M3, and M7 are integrally formed. In addition, the gates of the transistors M2 and M4 are integrally formed.

The resistor R is a stacked body of multiple conductors and multiple insulators. The resistor R is a resistive element having a tunnel junction. The resistor R is, for example, a two-terminal device, and is coupled in series to the transistor M7. The resistor R has a structure in which the conductors and the insulators are alternately stacked. The insulator has a film thickness which is reduced so that a tunneling effect occurs. Note that the resistor R has a resistance value determined based on the thickness of the insulator, the material of the insulator, the number of stacked films, and the like. By adjusting the film thickness and the like of the insulator, it is possible to implement a high-resistive element with a small area. The resistor R may be, for example, a high-resistive element having a resistance value of 1MΩ or greater. In the example of the layout illustrated in FIG. 7, the resistor R is formed so as to overlap one of the source and the drain of the transistor M7.

FIG. 8 is a diagram illustrating a configuration example of the resistor of the imaging device 1 according to the embodiment of the present disclosure. As an example, as illustrated in FIG. 8, the resistor R includes insulators 51, 52, and 53 and conductors 61, 62, 63, and 64. The insulators 51 to 53 include, for example, silicon oxide (SiOx). Alternatively, the insulators 51 to 53 may include silicon nitride (SiNx). Note that the insulators 51 to 53 may include at least one of oxides such as hafnium (Hf), zirconium (Zr), titanium (Ti), aluminum (Al), and magnesium (Mg) elements. The insulators 51 to 53 may include a semiconductor material or other materials.

The conductors 61 to 64 include, for example, titanium nitride (TiN). Alternatively, the conductors 61 to 64 may include at least one of oxides or nitrides such as tantalum (Ta), tungsten (W), and copper (Cu) elements. Note that the conductors 61 to 64 may include a semiconductor material or other materials. That is, for example, the conductors 61 to 64 may include Ti, Ta, W, Cu, Ru, Pt, Ir, In, Sn, Zn, Ga, or C, or a compound, oxide, or nitride thereof. The conductors 61 to 64 may include the same material or different materials. Example configurations of the resistor R include $TiN/SiO_2/TiN$, $TiN/ZrO_2/TiN$, $ITO/ZrO_2/ITO$, $TiN/HfO_2/ITO$, $TiN/Al_2O_3/TiN$, and CoFeB/MgO/CoFeB. Note that the configuration and material of the tunnel resistive element are not limited to the above-described examples, and any configuration and material may be selected as long as a tunnel barrier is formed, and a desired resistance value is obtained.

As described above, by using the stacked tunnel resistive element as the resistor R, voltage dependence of the resistance value of the resistor R may be reduced. Therefore, it is possible to reduce variations in current flowing through the resistor R and the transistor M7, and to prevent the operation accuracy of the product-sum operation using the memory cell array 200 from being lowered.

Note that the resistor R may include a ferroelectric material or a magnetic material. The resistor R may be a ferroelectric tunnel junction (FTJ) element, a magnetic tunnel junction (MTJ) element, or another high-resistive element. The resistor R may be, for example, a MTJ element formed by sandwiching the insulator 55 by two magnetic bodies 65 and 66, as illustrated in FIG. 9. The resistor R may be an element configured to store data using residual polarization or the like.

Next, an example of a data writing process performed by the imaging device 1 will be described. When data is written to the memory cells 20 of the memory cell array 200, the memory control circuit 211 brings the potential of the word line WL illustrated in, for example, FIGS. 5 and 6 to a high potential. That is, the signal level of a signal supplied to the word line WL is set to a high level. Since the potential of the word line WL becomes a high level, the transistors M5 and M6 are brought into the on-states.

In addition, the potential of one bit line of the first bit line BL and the second bit line BLB is set to a high potential, and the potential of the other bit line is set to a low potential. That is, the signal level of the signal supplied to the one-bit line is set to a high level, and the signal level of the signal supplied to the other bit line is set to a low level. In this case, the potential of the first bit line BL is applied to the input unit 22*a* of the second inverter via the transistor M5. In addition, the potential of the second bit line BLB is supplied to the input unit 21*a* of the first inverter via the transistor M6. As a result, the signals held in the first holding node 31 and the second holding node 32 are updated, enabling data writing to the memory cell 20.

It is to be noted that, when data is read from the memory cell 20, for example, the first bit line BL and the second bit line BLB are pre-charged in advance. For example, the first bit line BL and the second bit line BLB are set to the same potential by the pre-charging. After the potentials of the first bit line BL and the second bit line BLB are pre-charged, the potential of the word line WL is brought to a high level. Since the potential of the word line WL becomes a high level, the transistors M5 and M6 are brought into the on-states.

Since the transistor M5 is brought into the on-state, the output unit 21*b* of the first inverter is electrically coupled to the first bit line BL. In addition, since the transistor M6 is brought into the on-state, the output unit 22*b* of the second inverter is electrically coupled to the second bit line BLB. In this case, the potential of the first bit line BL varies depending on the potential of the output unit 21*b* of the first inverter, that is, the potential of the first holding node 31. Further, the potential of the second bit line BLB varies depending on the potential of the output unit 22*b* of the second inverter, that is, the potential of the second holding node 32. In this way, the data stored in the memory cell 20, that is, the signals held by the first holding node 31 and the second holding node 32 may be read out to the first bit line BL and the second bit line BLB.

Next, an example of the product-sum operation process performed by the imaging device 1 will be described. When the product-sum operation is performed, the signal line L1 and the signal line L2 are pre-charged in advance. For example, the signal line L1 and the signal line L2 are set to the same potential by the pre-charging. In this case, the drain and the source of the transistor M7 have the same potential, and thus no current flows through the transistor M7 and the resistors R.

After the pre-charging, the signal Act inputted to each signal line L1 is set to a low level for a predetermined period of time. Since the signal Act is set at a low level, a potential difference is generated between the drain and the source of the transistor M7. This enables the transistor M7 to output a current corresponding to the potential of the second holding node 32 applied to the gate and the potential of the signal Act, and the resistor R.

When the signal Act is set at a low level and the potential of the second holding node 32 coupled to the transistor M7 is set at a high level, a current flows between the signal line L1 and the signal line L2 through the transistor M7. That is, a charge is generated which corresponds to the multiplication value of the signal value of a signal inputted via the signal line L1 and the signal value held in the memory cell 20. The transistor M7 in each of the multiple memory cells 20 coupled to the signal line L2 outputs a current corresponding to the signal value of the memory cell 20 inputted to the transistor M7 when the signal Act is set at the low level.

The potential of the signal line L2 decreases depending on the amount of the charge generated by the transistor M7 of each memory cells 20. In this case, the charges generated by the respective transistors M7 are added in the signal line L2, and a product-sum signal is generated as a result of the addition. In other words, the product-sum signal corresponding to the sum of the multiplication values is calculated in the signal line L2. In this way, the product-sum signal generated as a result of the product-sum operation may be read out to the memory signal processing circuit 212 via the signal line L2.

The memory signal processing circuit 212 performs AD conversion on the product-sum signal, which is an input analog signal. In this case, the memory signal processing circuit 212 makes it possible to improve the accuracy in the AD conversion by increasing the resolution of the ADC, that is, the number of bits in the AD conversion. Therefore, it is possible to improve the operation accuracy in the product-sum operation.

The imaging device 1 according to the present embodiment may perform control using a pulse-width-modulation (PWM) method in the product-sum operation. The memory control circuit 211 of the imaging device 1 outputs the signal Act, which is a pulse signal, to each memory cell 20 via the signal line L1. For example, the memory control circuit 211 controls the pulse-width of the signal Act differently for each signal line L1 or for each set of multiple signal lines L1.

For example, the signal Act inputted to each signal line L1 is set to a low level for different period of times for each signal line L1 or for each set of multiple signal lines L1. The transistor M7 of each memory cell 20 outputs a current corresponding to the pulse-width of the signal Act inputted to the memory cell 20. The charge corresponding to the period of time in which the signal Act is set at the low level is transferred from each memory cell 20 to the signal line L2 and added to each other. In the signal line L2, the output signals of the respective memory cells 20 corresponding to the pulse widths of the signals Act are added to form the product-sum signal. The potential of the product-sum signal varies depending on the pulse-widths of the respective signals Act inputted to the memory cell array 200.

FIG. 10 is a diagram illustrating an example of the product-sum operation process performed by the imaging device 1 according to the embodiment of the present disclosure. In FIG. 10, the voltage of the signal Act and the voltage of the product-sum signal are illustrated on the same time-axis. A signal Act [0] illustrated in FIG. 10 is a signal commonly inputted to a first memory cell row. Further, a signal Act [2], a signal Act [n-2], and a signal Act [n-1] are signals inputted to a second memory cell row, a n-1-th row, and a n-th row, respectively.

Each memory cell 20 of the memory cell array 200 receives the signal Act [0] to the signal Act [n-1] having waveforms illustrated in FIG. 10. As a result, as schematically illustrated in FIG. 10, the potential of the product-sum signal decreases over time in accordance with a low-level pulse-width Tact of each of the signal Act [0] to the signal Act [n-1].

As described above, by using the pulse signal as the signal Act, it is possible to obtain the product-sum signal corresponding to the signal value held in the memory cell 20 and the pulse width of the signal Act. In other words, the value to be multiplied by the signal value held in the memory cell 20 is adjusted by PWM driving. By using the PWM driving, it is possible to provide a multi-valued input signal, achieving a highly accurate product-sum operation.

It is to be noted that, although the configuration example of the imaging device 1 has been described above, the configuration of the imaging device 1 is merely an example, and the configuration of the imaging device 1 is not limited to the above-described example. For example, although the example in which the gate of the transistor M7 of the memory cell 20 is electrically coupled to the second holding node 32 has been described above, the gate of the transistor M7 may be electrically coupled to the first holding node 31, as illustrated in FIG. 11. One of the source and the drain of the transistor M7 is coupled in series to the resistor R, and is electrically coupled to the signal line L1 to which the signal Act is inputted. The other of the source and the drain of the transistor M7 is electrically coupled to the signal line L2. In this case, the transistor M7 is configured to generate the current corresponding to the potential of the first holding node 31 applied to the gate and the potential of the signal Act, and supply the generated current to the signal line L2. Although the control of the pulse width modulation method has been described above, the imaging device 1 may perform the control of a pulse amplitude modulation method. In this case as well, it is possible to provide a multivalued input signal, achieving a highly accurate product-sum operation.

[Workings and Effects]

The operation device (the imaging device 1) according to the present embodiment includes the memory cell array 200 including the multiple memory cells 20. The multiple memory cells 20 each includes the first inverter (INV1) including the first input unit (the input unit 21*a*) and a first output unit (the output unit 21*b*), the second inverter (INV2) including the second input unit (the input unit 22*a*) coupled to the first output unit and the second output unit (the output unit 22*b*) coupled to the first input unit and outputting the first signal, the first transistor (the transistor M7) to which the first signal is inputted from the second output unit, and the resistor (the resistor R) coupled in series to the first transistor.

The imaging device 1 according to the present embodiment includes the transistor M7 to which the signal held in the memory cell 20 is inputted, and the resistor R coupled in series to the transistor M7. The charges generated by the transistors M7 of the respective memory cells 20 are added in the signal line L2 to obtain the product-sum signal. It is therefore possible to perform the product-sum operation with a small memory cell area, and to prevent the memory cell area from increasing, It is also possible to perform a highly accurate product-sum operation with a small cell area.

Next, a modification example of the present disclosure will be described. Hereinafter, the same components as those in the above-described embodiment are denoted by the same reference numerals, and description thereof will be omitted as appropriate.

2. Modification Examples (2-1. Modification Example 1)

FIG. 12 is a diagram illustrating a configuration example of the memory cell array 200 of the imaging device 1 according to Modification Example 1 of the present disclosure. In the example illustrated in FIG. 12, in the memory cell array 200, a signal line L2*a* to which a first product-sum signal is transmitted and a signal line L2*b* to which a second product-sum signal is transmitted are provided for each of the multiple memory cells 20 arranged in the vertical direction. In other words, the signal line L2*a* and the signal line L2*b* are provided for the memory cell column including the multiple memory cells 20 arranged in the vertical direction. For example, the signal line L2*a* and the signal line L2*b* are coupled to the memory signal processing circuit 212 described above. The memory signal processing circuit 212 receives the first product-sum signal via the signal line L2*a*, and receives the second product-sum signal via the signal line L2*b*.

Figure 13:
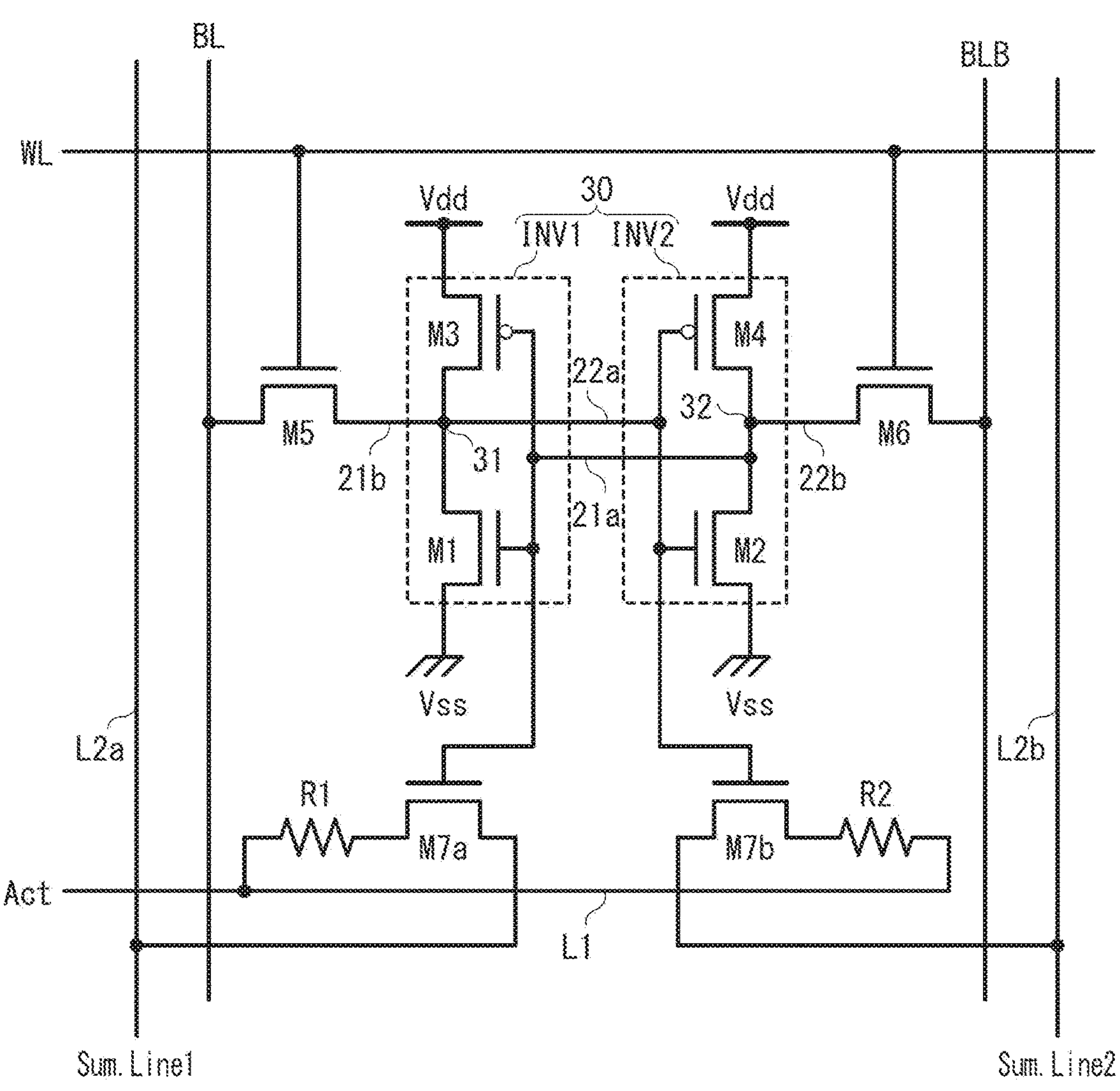
FIG. 13 is a diagram illustrating a configuration example of a memory cell of the imaging device according to Modification Example 1 of the present disclosure.

FIG. 13 is a diagram illustrating a configuration example of the memory cell 20 of the imaging device 1 according to Modification Example 1 of the present disclosure. The memory cell 20 includes transistors M7*a* and M7*b*, and resistors R1 and R2. The transistor M7*a* and the resistor R1 have the same configuration as the transistor M7 and the resistor R in the embodiment described above, respectively. A gate of the transistor M7*a* is electrically coupled to the second holding node 32, and receives a signal is inputted from the output unit 22*b* of the second inverter INV2. One of a source and a drain of the transistor M7*a* is coupled to the resistor R1 and is electrically coupled to the signal line L1 to which the signal Act is inputted. The other of the source and the drain of the transistor M7*a* is electrically coupled to the signal line L2*a*. The transistor M7*a* is configured to generate a current corresponding to the potential of the second holding node 32 applied to the gate and the potential of the signal Act, and supply the generated current to the signal line L2*a*. The charges generated by the transistors M7*a* of the respective memory cells 20 are added in the signal line L2*a* to obtain the first product-sum signal.

A gate of the transistor M7*b* is electrically coupled to the first holding node 31, and receives a signal from the output unit 21*b* of the first inverter INV1. One of a source and a drain of the transistor M7*b* is coupled to the resistor R2 and is electrically coupled to the signal line L1 to which the signal Act is inputted. The other of the source and the drain of the transistor M7*b* is electrically coupled to the signal line L2*b*. The transistor M7*b* is configured to generate a current corresponding to the potential of the first holding node 31 applied to the gate and the potential of the signal Act, and supply the generated current to the signal line L2*b*. The charges generated by the transistors M7*b* of the respective memory cells 20 are added in the signal line L2*b* to obtain the second product-sum signal. As described above, in the present modification example, it is possible to read out the first product-sum signal to the signal line L2*a*, and read out the second product-sum signal to the signal line L2*b*. Since it is possible to read out the first product-sum signal and the second product-sum signal, it is possible to achieve a highly accurate product-sum operation.

(2-2. Modification Example 2 )

Figure 14:
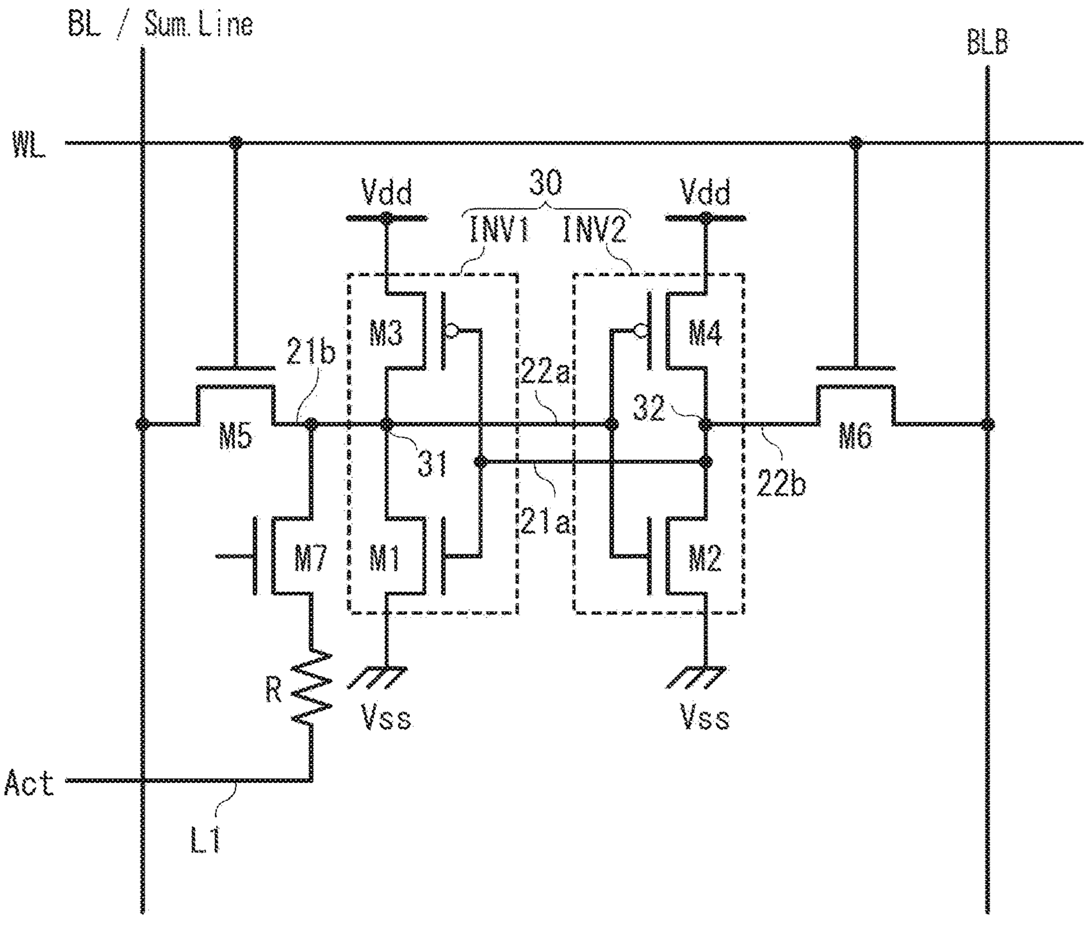
FIG. 14 is a diagram illustrating a configuration example of a memory cell of an imaging device according to Modification Example 2 of the present disclosure.

FIG. 14 is a diagram illustrating a configuration example of the memory cell 20 of the imaging device 1 according to Modification Example 2 of the present disclosure. One of the source and the drain of the transistor M7 is electrically coupled to the first holding node 31. The other of the source and the drain of the transistor M7 is coupled in series to the resistor R, and is electrically coupled to the signal line L1 to which the signal Act is inputted. When the product-sum operation is performed, the transistor M7 is configured to generate a current corresponding to the potential of the first holding node 31 and the potential of the signal Act inputted, and supply the generated current to the first bit line BL.

The first bit line BL also serves as a summation line, and the charges from the respective memory cells 20 are added in the first bit line BL to obtain the product-sum signal. Note that, when the product-sum operation is performed, the signal Act, which is a pulsed signal, may be inputted to the word line WL. Alternatively, a grounding potential or a power supply potential may be applied to the signal line L1. In the case of the present modification example as well, it is possible to obtain the same effects as those of the imaging device of the above-described embodiment.

Figure 15:
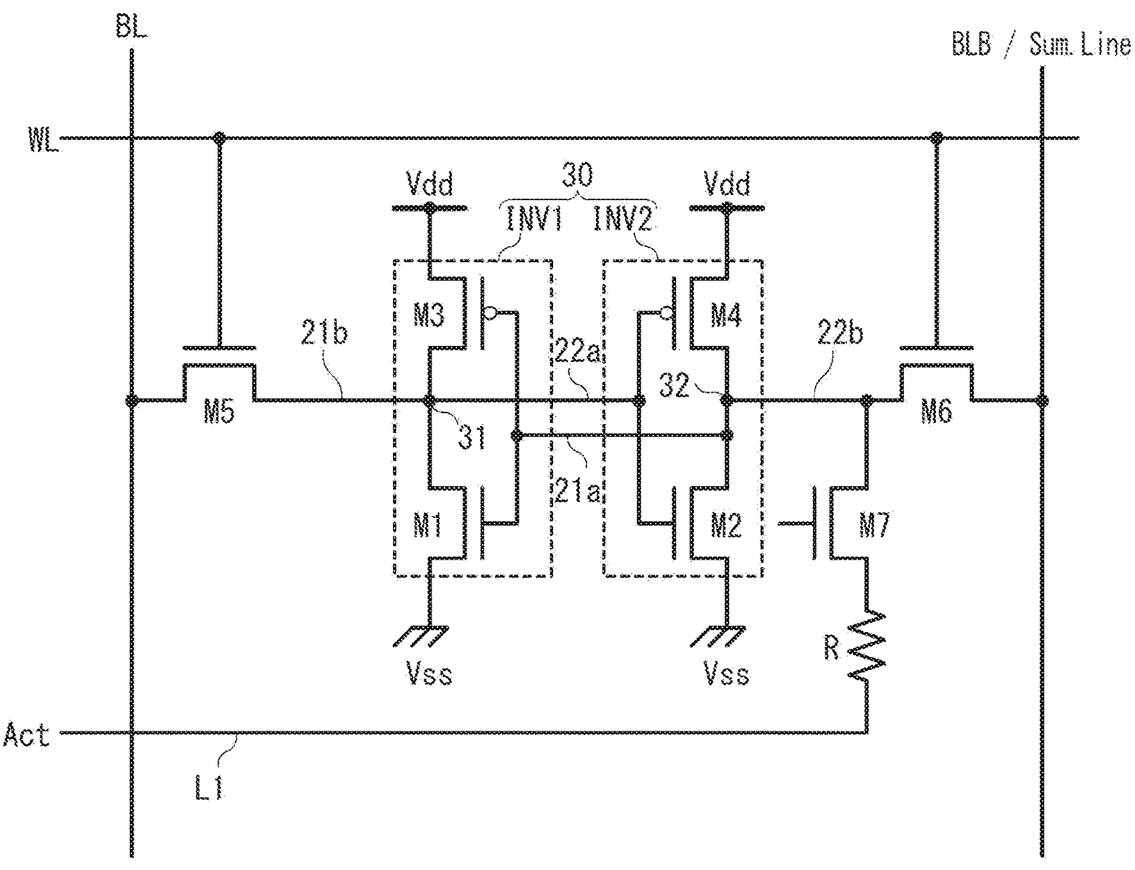
FIG. 15 is a diagram illustrating another configuration example of the memory cell of the imaging device according to Modification Example 2 of the present disclosure.

It is to be noted that, as illustrated in FIG. 15, one of the source and the drain of the transistor M7 may be electrically coupled to the second holding node 32. The other of the source and the drain of the transistor M7 is coupled to the resistor R and is electrically coupled to the signal line L1 to which the signal Act is inputted, as in the case of FIG. 14. In this case, the transistor M7 is configured to generate a current corresponding to the potential of the second holding node 32 and the potential of the signal Act inputted, and supply the generated current to the second bit line BLB. The second bit line BLB also serves as a summation line, and the charges from the respective memory cells 20 may be added in the second bit line BLB to obtain the product-sum signal.

Figure 16:
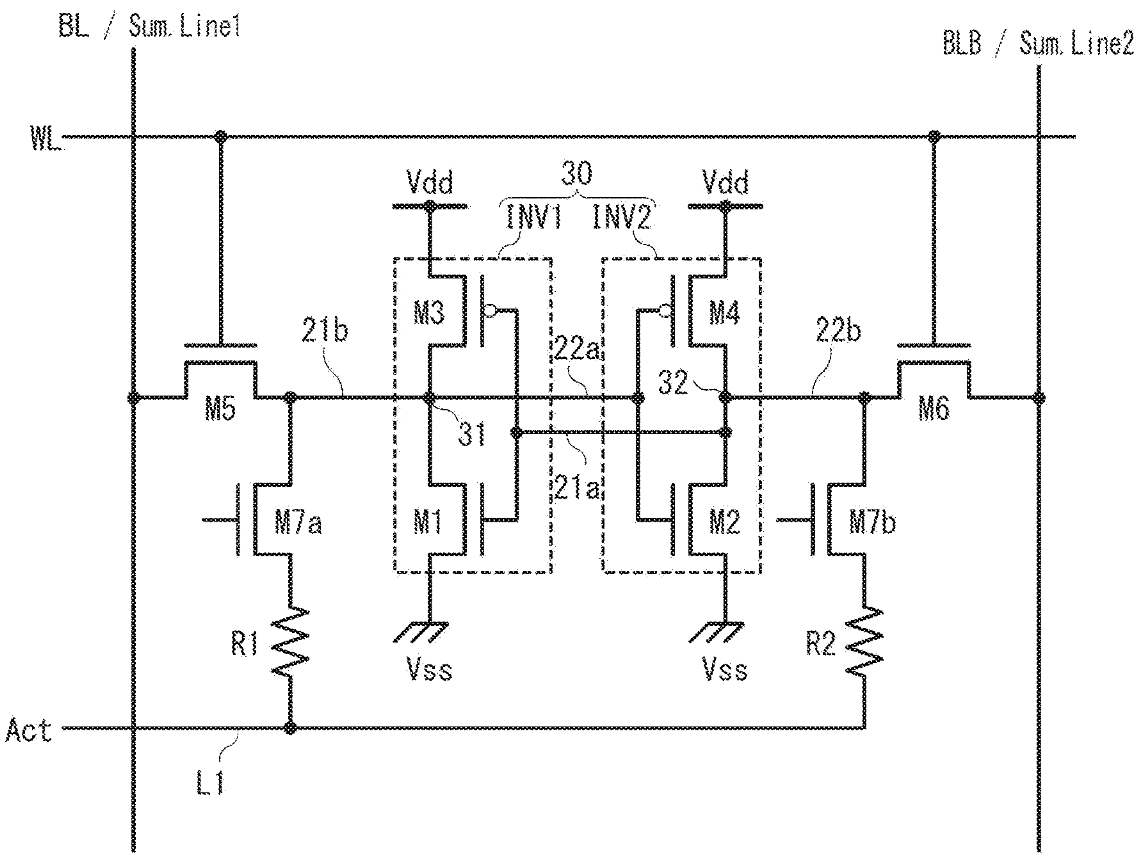
FIG. 16 is a diagram illustrating another configuration example of the memory cell of the imaging device according to Modification Example 2 of the present disclosure.

FIG. 16 is a diagram illustrating another configuration example of the memory cell 20 of the imaging device 1 according to Modification Example 2 of the present disclosure. The memory cell 20 includes the transistors M7*a* and M7*b* and the resistors R1 and R2. One of the source and the drain of the transistor M7*a* is electrically coupled to the first holding node 31. In addition, one of the source and the drain of the transistor M7*b* is electrically coupled to the second holding node 32.

When the product-sum operation is performed, the transistor M7*a* is configured to generate a current corresponding to the potential of the first holding node 31 and the potential of the signal Act, and supply the generated current to the first bit line BL. The first bit line BL also serves as a first summation line, and the charges from the respective memory cells 20 may be added in the first bit line BL to obtain the first product-sum signal. Further, the transistor M7*b* is configured to generate a current corresponding to the potential of the second holding node 32 and the potential of the signal Act, and supply the generated current to the second bit line BLB. The second bit line BLB also serves as a second summation line, and the charges from the respective memory cells 20 may be added in the second bit line BLB to obtain the second product-sum signal.

(2-3. Modification Example 3)

Figure 17:
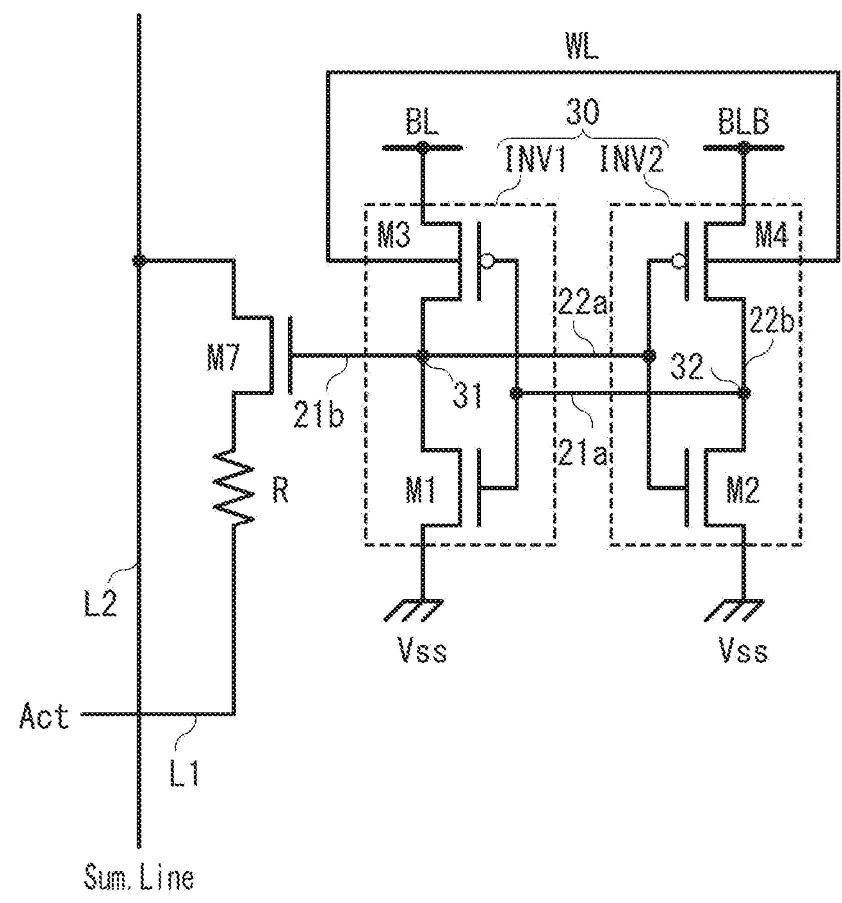
FIG. 17 is a diagram illustrating a configuration example of a memory cell of an imaging device according to Modification Example 3 of the present disclosure.

FIG. 17 is a diagram illustrating a configuration example of the memory cell 20 of the imaging device 1 according to Modification Example 3 of the present disclosure. A back gate of each of the transistor M3 and the transistor M4 is electrically coupled to the word line WL. The source of the transistor M3 is coupled to the first bit line BL, and the source of the transistor M4 is coupled to the second bit line BLB. The first bit line BL and the second bit line BLB also serve as power supply lines for the transistor M3 and the transistor M4, respectively. In the present modification example, when data is written, threshold voltages of the transistors M3 and M4 are adjusted by the potentials applied to the back gates of the transistors M3 and M4 via the word line WL. This enables the on/off control of the transistors M3 and M4 and data writing to the memory cell 20 in accordance with the signals of the first bit line BL and the second bit line BLB.

Figure 18:
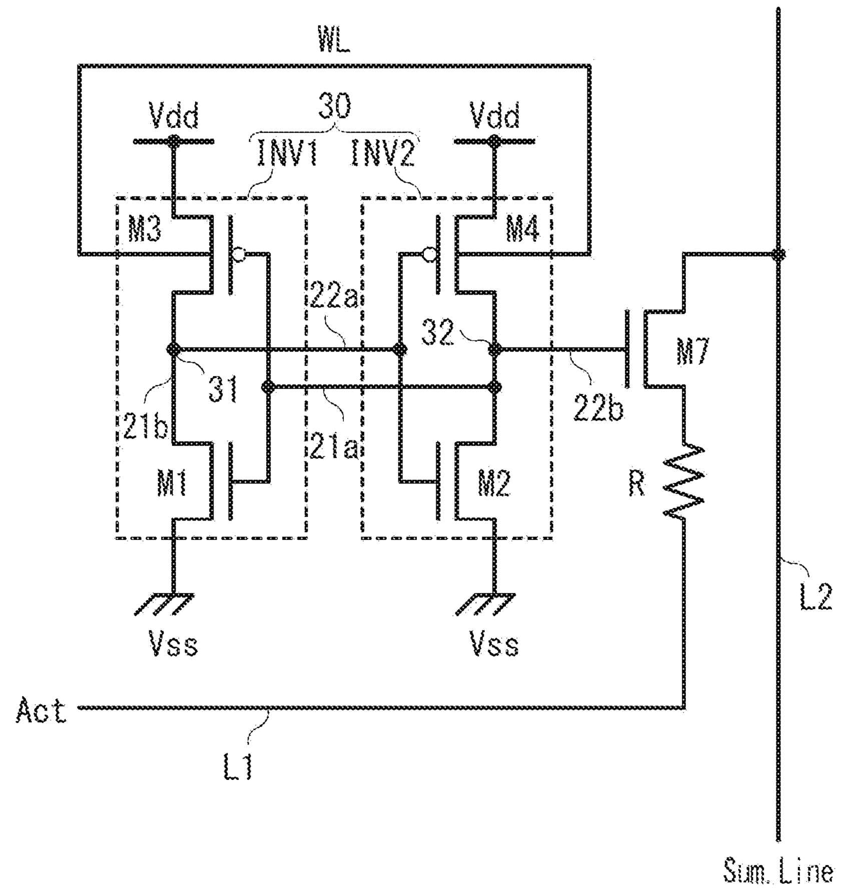
FIG. 18 is a diagram illustrating another configuration example of the memory cell of the imaging device according to Modification Example 3 of the present disclosure.

In the example illustrated in FIG. 17, the gate of the transistor M7 is electrically coupled to the first holding node 31. One of the source and the drain of the transistor M7 is coupled to the resistor R, and is electrically coupled to the signal line L1 to which the signal Act is inputted. The other of the source and the drain of the transistor M7 is electrically coupled to the signal line L2. The transistor M7 is configured to generate a current corresponding to the potential of the first holding node 31 and the potential of the signal Act, and supply the generated current to the signal line L2. As illustrated in FIG. 18, the gate of the transistor M7 may be electrically coupled to the second holding node 32. In the example illustrated in FIG. 18, one of the source and the drain of the transistor M7 is coupled to the resistor R, and is electrically coupled to the signal line L1 to which the signal Act is inputted. The other of the source and the drain of the transistor M7 is electrically coupled to the signal line L2. In this case, the transistor M7 is configured to generate a current corresponding to the potential of the second holding node 32 and the potential of the signal Act, and supply the generated current to the signal line L2. In the case of the present modification example as well, it is possible to obtain the same effects as those of the imaging device of the above-described embodiment.

Figure 19:
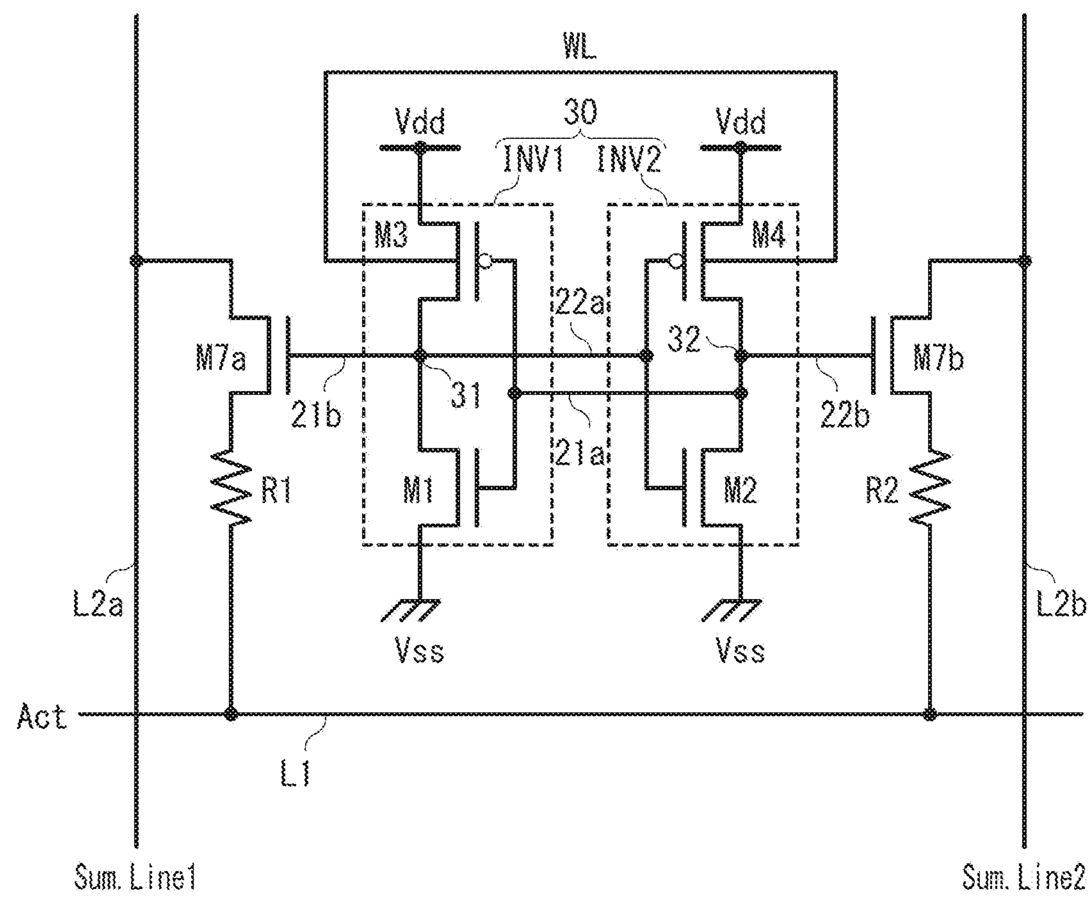
FIG. 19 is a diagram illustrating another configuration example of the memory cell of the imaging device according to Modification Example 3 of the present disclosure.

FIG. 19 is a diagram illustrating another configuration example of the memory cell 20 of the imaging device 1 according to Modification Example 3 of the present disclosure. The memory cell 20 includes the transistors M7*a* and M7*b* and the resistors R1 and R2. The gate of the transistor M7*a* is electrically coupled to the first holding node 31. The transistor M7*a* is configured to generate a current corresponding to the potential of the first holding node 31 and the potential of the signal Act, and supply the generated current to the signal line L2*a*. The charges generated by the transistors M7*a* of the respective memory cells 20 are added in the signal line L2*a* to obtain the first product-sum signal.

The gate of the transistor M7*b* is electrically coupled to the second holding node 32. The transistor M7*b* is configured to generate a current corresponding to the potential of the second holding node 32 and the potential of the signal Act, and supply the generated current to the signal line L2*b*. The charges generated by the transistors M7*b* of the respective memory cells 20 are added in the signal line L2*b* to obtain the second product-sum signal. As described above, in the present modification example, it is possible to read out the first product-sum signal to the signal line L2*a*, and read out the second product-sum signal to the signal line L2*b*. Since it is possible to read out the first product-sum signal and the second product-sum signal, it is possible to achieve a highly accurate product-sum operation.

3. Application Examples

Figure 20:
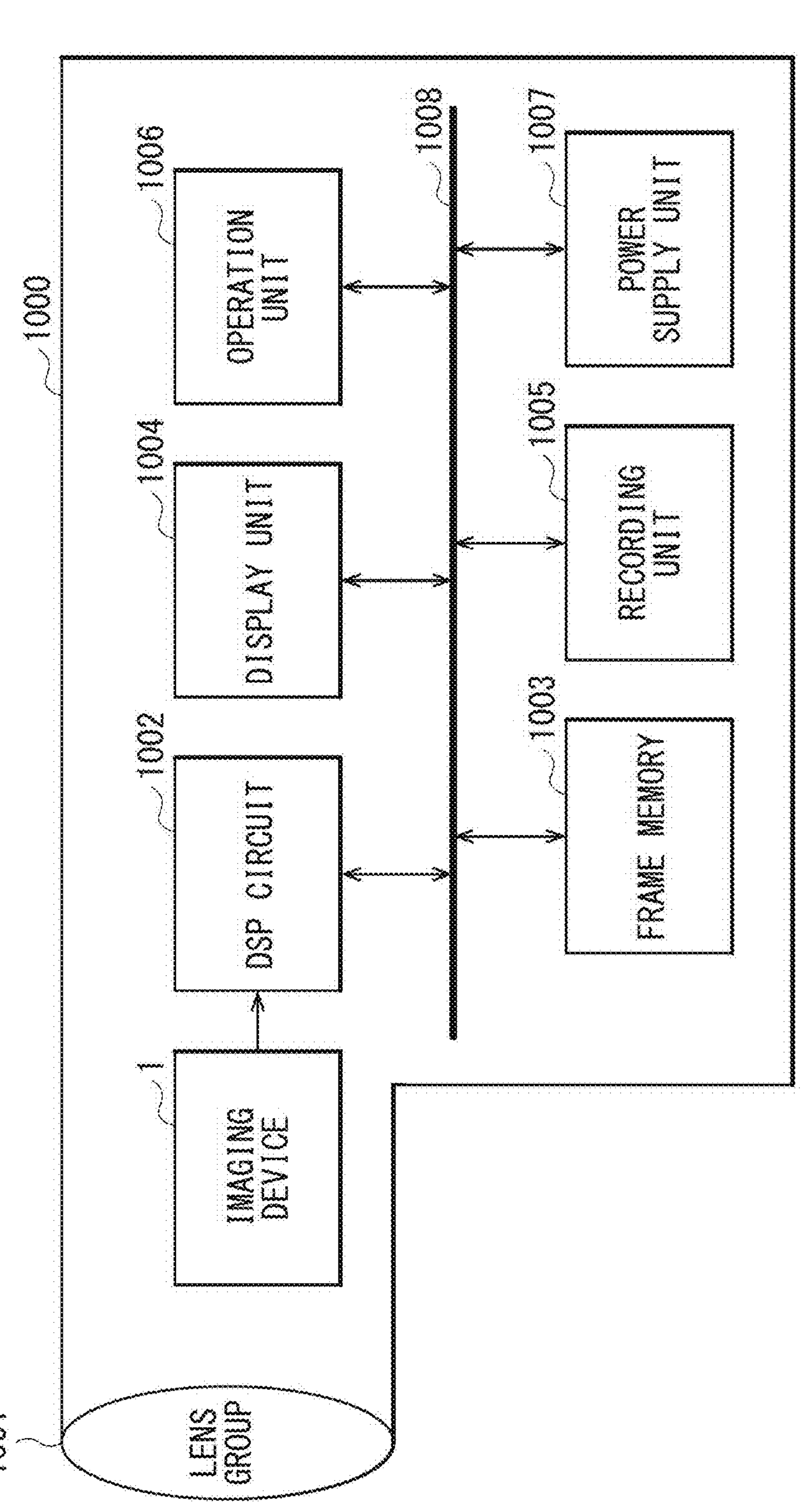
FIG. 20 is a block diagram illustrating a configuration example of an electronic apparatus including an imaging device.

The above-described imaging device 1 or the like is applicable, for example, to any type of electronic apparatus with an imaging function including a camera system such as a digital still camera or a video camera, a mobile phone having an imaging function, and the like. FIG. 20 illustrates a schematic configuration of an electronic apparatus 1000.

The electronic apparatus 1000 includes, for example, a lens group 1001, the imaging device 1, a digital signal processor (DSP) circuit 1002, a frame memory 1003, a display unit 1004, a recording unit 1005, an operation unit 1006, and a power supply unit 1007. They are coupled to each other via a bus line 1008.

The lens group 1001 takes in incident light (image light) from a subject, and forms an image on an imaging surface of the imaging device 1. The imaging device 1 converts the amount of incident light formed as an image on the imaging surface by the lens group 1001 into electric signals on a pixel-by-pixel basis, and supplies the DSP circuit 1002 with the electric signals as pixel signals.

The DSP circuit 1002 is a signal processing circuit that processes signals supplied from the imaging device 1. The DSP circuit 1002 outputs image data obtained by processing the signals from the imaging device 1. The frame memory 1003 temporarily holds the image data processed by the DSP circuit 1002 on a frame-by-frame basis.

The display unit 1004 includes, for example, a panel-type display device such as a liquid crystal panel or an organic electro-luminescence (EL) panel, and records image data of a moving image or a still image captured by the imaging device 1 in a recording medium such as a semiconductor memory or a hard disk.

The operation unit 1006 outputs an operation signal for a variety of functions of the electronic apparatus 1000 in accordance with an operation by a user. The power supply unit 1007 supplies the DSP circuit 1002, the frame memory 1003, the display unit 1004, the recording unit 1005, and the operation unit 1006 with various kinds of power for operations of these supply targets as appropriate.

4. Practical Application Examples (Example to Practical Application to Mobile Body)

The technology according to the present disclosure (present technology) is applicable to a variety of products. For example, the technology according to the present disclosure may be implemented as a device mounted on any type of mobile body such as an automobile, an electric vehicle, a hybrid electric vehicle, a motorcycle, a bicycle, a personal mobility, an aircraft, a drone, a vessel, or a robot.

Figure 21:
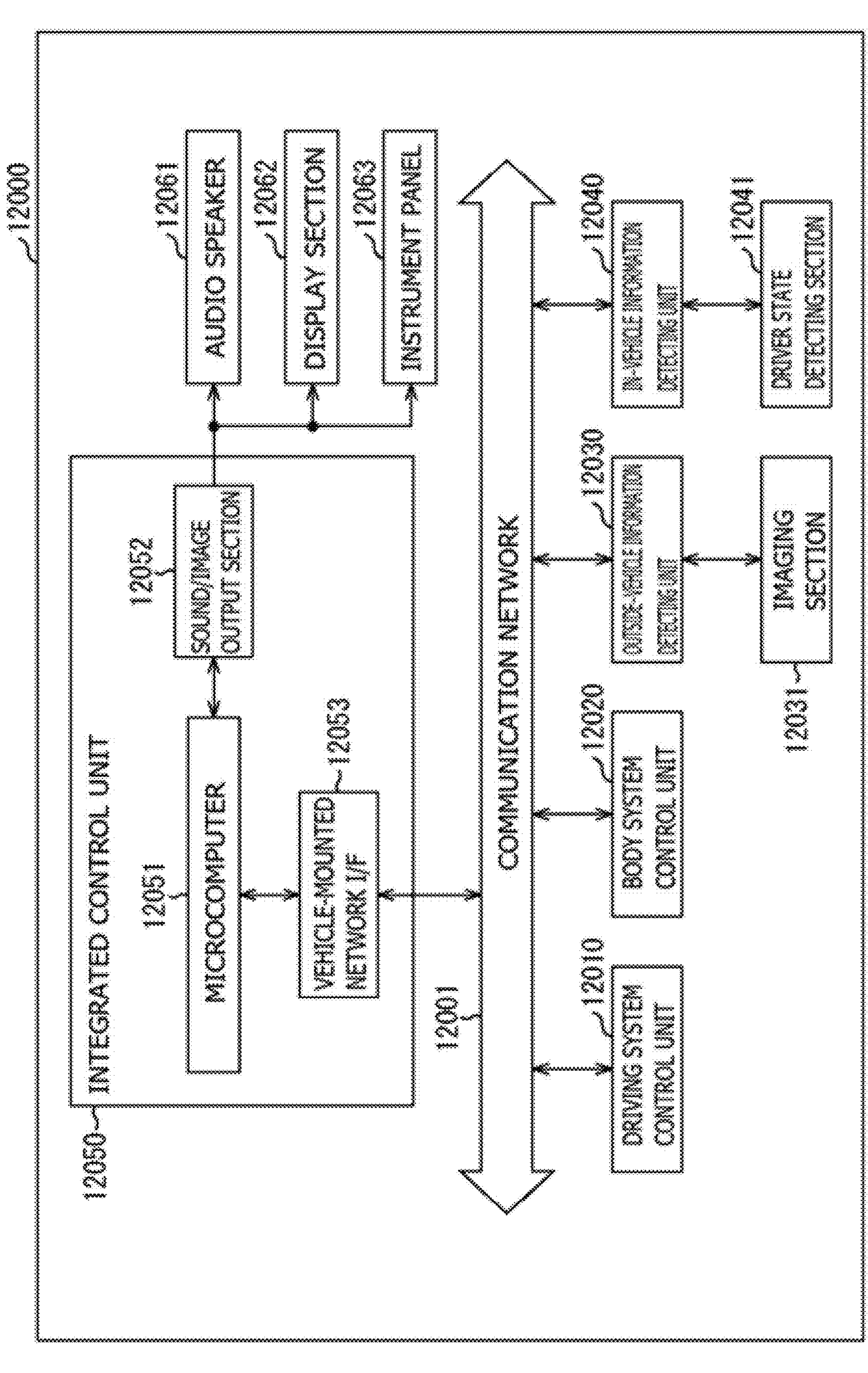
FIG. 21 is a block diagram depicting an example of schematic configuration of a vehicle control system.

FIG. 21 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 21, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer

12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 21, an audio speaker 12061, a display section 12062, and an instrument panel 12063 are illustrated as the output device. The display section 12062 may, for example, include at least one of an on-board display and a head-up display.

Figure 22:
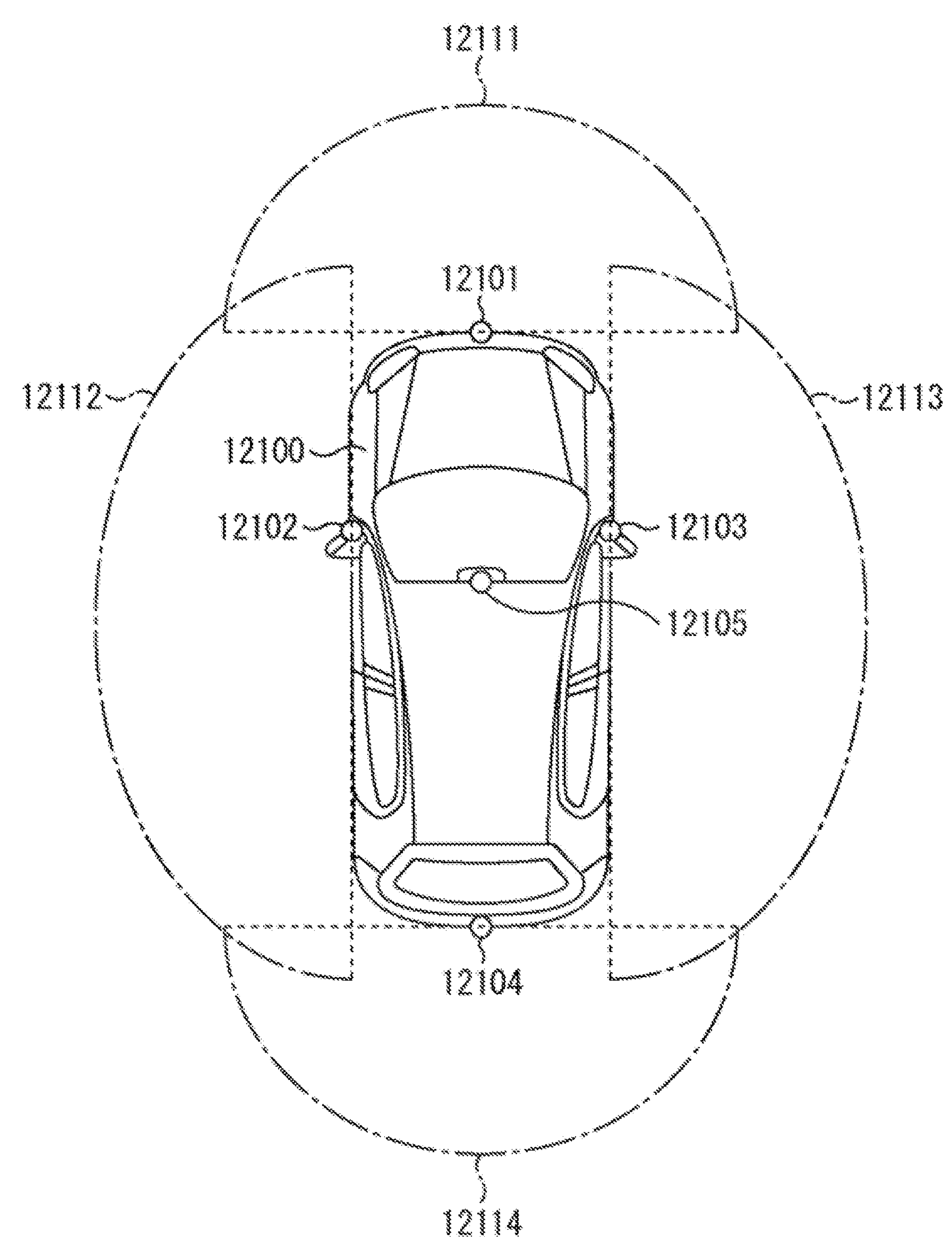
FIG. 22 is a diagram of assistance in explaining an example of installation positions of an outside-vehicle information detecting section and an imaging section.

FIG. 22 is a diagram depicting an example of the installation position of the imaging section 12031.

In FIG. 22, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 22 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The description has been given hereinabove of one example of the mobile body control system to which the technology according to the present disclosure is applicable. The technology according to the present disclosure is applicable to the imaging section 12031, for example, of the configurations described above. Specifically, for example, the imaging device 1 or the like can be applied to the imaging section 12031. Applying the technology according to the present disclosure to the imaging section 12031 makes it possible to perform highly accurate control utilizing the photographed image in the mobile body control system.

(Example of Practical Application to Endoscopic Surgery System)

The technology according to the present disclosure (the present technology) is applicable to various products. For example, the technology according to the present disclosure may be applied to an endoscopic surgery system.

Figure 23:
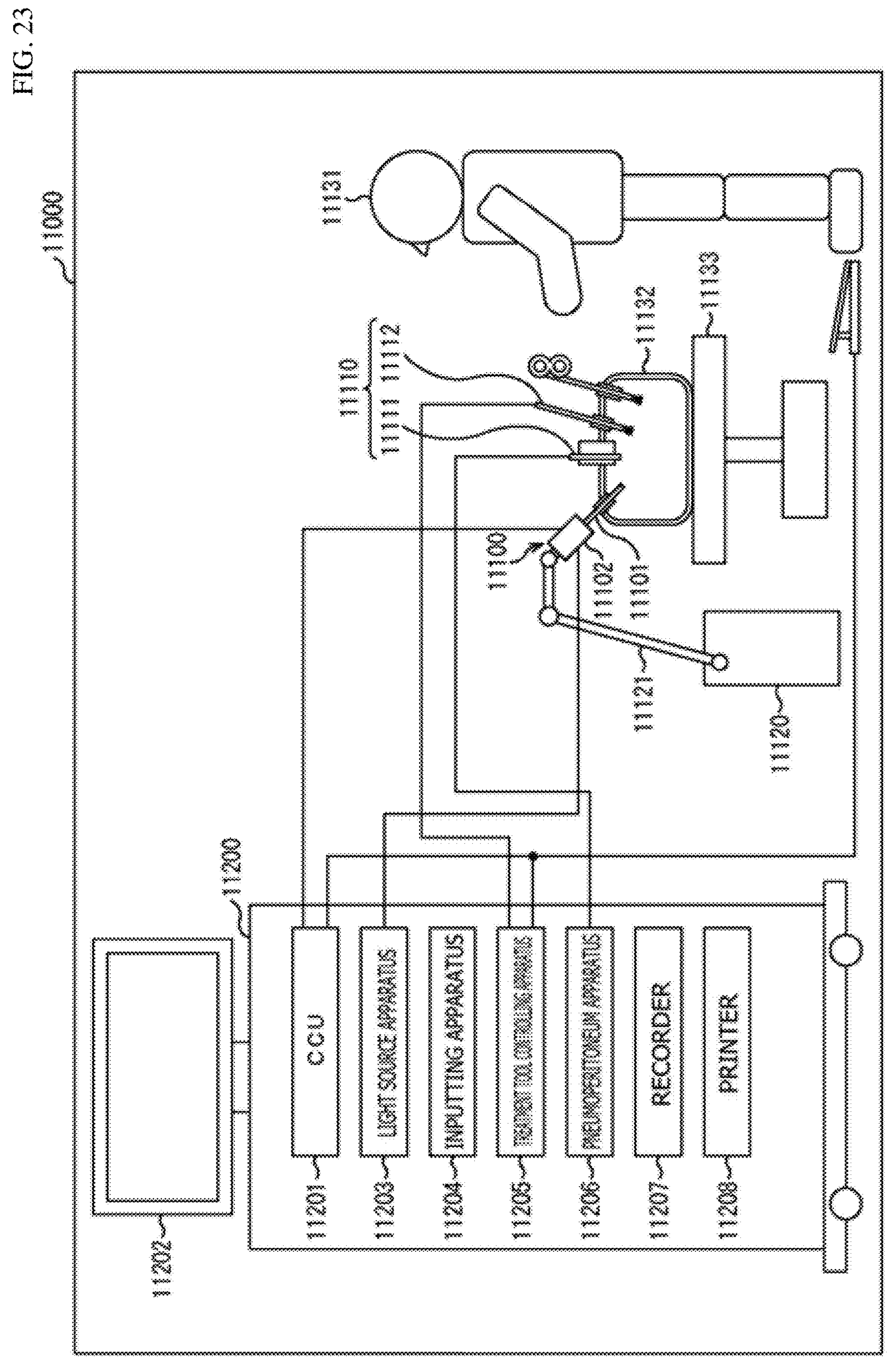
FIG. 23 is a view depicting an example of a schematic configuration of an endoscopic surgery system.

FIG. 23 is a view depicting an example of a schematic configuration of an endoscopic surgery system to which the technology according to an embodiment of the present disclosure (present technology) can be applied.

In FIG. 23, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 24 is a block diagram depicting an example of a functional configuration of the camera head 11102 and the CCU 11201 depicted in FIG. 23.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The image pickup unit 11402 includes image pickup elements. The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The description has been given hereinabove of one example of the endoscopic surgery system to which the technology according to the present disclosure is applicable. The technology according to an embodiment of the present disclosure is suitably applicable to, for example, the image pickup unit 11402 provided in the camera head 11102 of the endoscope 11100 of the configurations described above. Applying the technology according to the present disclosure to the image pickup unit 11402 makes it possible to provide the endoscope 11100 having high definition.

Although the description has been given hereinabove of the present disclosure with reference to the embodiment, the modification examples, the application examples, and the practical application examples, the present technology is not limited to the foregoing embodiment and the like, and may be modified in a variety of ways. For example, although the foregoing modification examples have been described as modification examples of the foregoing embodiment, the configurations of the respective modification examples may be combined as appropriate.

It is to be noted that the effects described herein are merely exemplary and are not limited to the description, and may further include other effects. In addition, the present disclosure may also have the following configurations.

(1) An operation device including a memory cell array including multiple memory cells, the multiple memory cells each including:

a first inverter including a first input unit and a first output unit;

a second inverter including a second input unit coupled to the first output unit and a second output unit coupled to the first input unit, the second output unit outputting a first signal;

a first transistor to which the first signal is inputted from the second output unit; and a resistor coupled in series to the first transistor.

(2) The operation unit according to (1), in which the first transistor has a gate coupled to the first output unit, and the resistor is coupled to a source or a drain of the first transistor.

(3) The operation unit according to (1) or (2), including:

a first bit line; and a second bit line, in which the multiple memory cells each include a second transistor configured to couple the first output unit to the first bit line, and a third transistor configured to couple the second output unit to the second bit line.

(4) The operation device according to any one of (1) to (3), in which the multiple memory cells are flip-flop memory cells.

(5) The operation device according to any one of (1) to (4), in which the memory cell array performs a product-sum operation based on the first signal for each of the multiple memory cells.

(6) The operation device according to any one of (1) to (5), in which the memory cell array generates a second signal which is an analog signal in the product-sum operation.

(7) The operation device according to any one of (1) to (6), including a signal processing circuit that processes the second signal, in which the signal processing circuit performs at least one of analog to-digital conversion processing, processing using an activation arithmetic function, and pooling processing.

(8) The operation device according to any one of (1) to (7), including a signal line electrically coupled to the first transistor of each of the multiple memory cells, the signal line transmitting the second signal generated in the product-sum operation.

(9) The operation device according to any one of (1) to (8), including a control circuit that controls the multiple memory cells, in which the signal processing circuit and the signal line are provided side by side in a first direction, and the control circuit and the signal line are provided side by side in a direction orthogonal to the first direction.

(10) The operation device according to (9), in which the resistor is a resistive element having a tunnel junction.

(11) The operation device according to (10), in which the resistive element includes a magnetic material.

(12) The operation device according to (10), in which the resistive element includes a ferroelectric material.

(13) A solid-state imaging device comprising a memory cell array including multiple memory cells, the multiple memory cells each including:

a first inverter including a first input unit and a first output unit;

a second inverter including a second input unit coupled to the first output unit and a second output unit coupled to the first input unit, the second output unit outputting a first signal;

a first transistor to which the first signal is inputted from the second output unit; and a resistor coupled in series to the first transistor.

This application claims the benefit of Japanese Priority Patent Application JP2021-193741 filed with the Japan Patent Office on Nov. 30, 2021, the entire contents of which are incorporated herein by refence.

It should be understood by those skilled in the art that various modifications, combinations, sub-combinations, and alterations may occur depending on design requirements and other factors insofar as they are within the scope of the appended claims or the equivalents thereof.

The invention claimed is:

1. An operation device comprising a memory cell array including multiple memory cells, the multiple memory cells each including:

a first inverter including a first input and a first output;

a second inverter including a second input coupled to the first output and a second output coupled to the first input, the second output outputting a first signal;

a first transistor to which the first signal is inputted from the second output; and a resistor coupled in series to the first transistor, wherein the first transistor has a gate coupled to the first output, and the resistor is coupled to a source or a drain of the first transistor.

2. The operation device according to claim 1, further comprising:

a first bit line; and a second bit line, wherein the multiple memory cells each include a second transistor configured to couple the first output to the first bit line, and a third transistor configured to couple the second output to the second bit line.

3. The operation device according to claim 1, wherein the multiple memory cells are flip-flop memory cells.

4. The operation device according to claim 1, wherein the memory cell array performs a product-sum operation based on the first signal for each of the multiple memory cells.

5. The operation device according to claim 4, wherein the memory cell array generates a second signal which is an analog signal in the product-sum operation.

6. The operation device according to claim 5, further comprising:

a signal processing circuit that processes the second signal, wherein the signal processing circuit performs at least one of analog-to-digital conversion processing, processing using an activation arithmetic function, and pooling processing.

7. The operation device according to claim 6, further comprising:

a signal line electrically coupled to the first transistor of each of the multiple memory cells, the signal line transmitting the second signal generated in the product-sum operation.

8. The operation device according to claim 7, further comprising:

a control circuit that controls the multiple memory cells, wherein the signal processing circuit and the signal line are provided side by side in a first direction, and the control circuit and the signal line are provided side by side in a direction orthogonal to the first direction.

9. The operation device according to claim 1, wherein the resistor is a resistive element having a tunnel junction.

10. The operation device according to claim 9, wherein the resistive element includes a magnetic material.

11. The operation device according to claim 9, wherein the resistive element includes a ferroelectric material.

12. A solid-state imaging device comprising a memory cell array including multiple memory cells, the multiple memory cells each including:

a first inverter including a first input and a first output;

a second inverter including a second input coupled to the first output and a second output coupled to the first input, the second output outputting a first signal;

a first transistor to which the first signal is inputted from the second output; and a resistor coupled in series to the first transistor, wherein the first transistor has a gate coupled to the first output, and the resistor is coupled to a source or a drain of the first transistor.

13. The solid-state imaging device according to claim 12, further comprising:

a first bit line; and a second bit line, wherein the multiple memory cells each include a second transistor configured to couple the first output to the first bit line, and a third transistor configured to couple the second output to the second bit line.

14. The solid-state imaging device according to claim 12, wherein the multiple memory cells are flip-flop memory cells.

15. The solid-state imaging device according to claim 12, wherein the memory cell array performs a product-sum operation based on the first signal for each of the multiple memory cells.

16. The solid-state imaging device according to claim 15, wherein the memory cell array generates a second signal which is an analog signal in the product-sum operation.

17. The solid-state imaging device according to claim 16, further comprising:

a signal processing circuit that processes the second signal, wherein the signal processing circuit performs at least one of analog-to-digital conversion processing, processing using an activation arithmetic function, and pooling processing.

18. The solid-state imaging device according to claim 17, further comprising:

a signal line electrically coupled to the first transistor of each of the multiple memory cells, the signal line transmitting the second signal generated in the product-sum operation.

19. The solid-state imaging device according to claim 18, further comprising:

a control circuit that controls the multiple memory cells, wherein the signal processing circuit and the signal line are provided side by side in a first direction, and the control circuit and the signal line are provided side by side in a direction orthogonal to the first direction.

20. The solid-state imaging device according to claim 12, wherein the resistor is a resistive element having a tunnel junction.

* * * * *